US009571135B2

(12) United States Patent
Langer

(10) Patent No.: US 9,571,135 B2
(45) Date of Patent: Feb. 14, 2017

(54) ADJUSTING POWER AMPLIFIER STIMULI BASED ON OUTPUT SIGNALS

(71) Applicant: Intel IP Corporation, Santa Clara, CA (US)

(72) Inventor: Andreas Langer, Lohhof (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/663,640

(22) Filed: Mar. 20, 2015

(65) Prior Publication Data
US 2016/0277045 A1  Sep. 22, 2016

(51) Int. Cl.
*H04B 1/04* (2006.01)
*H03L 7/087* (2006.01)
(Continued)

(52) U.S. Cl.
CPC .......... *H04B 1/0475* (2013.01); *H03F 1/0222* (2013.01); *H03F 1/0233* (2013.01); *H03F 1/302* (2013.01); *H03F 1/3247* (2013.01); *H03F 1/3258* (2013.01); *H03F 1/3282* (2013.01); *H03F 1/56* (2013.01); *H03F 3/195* (2013.01); *H03F 3/245* (2013.01); *H03L 7/087* (2013.01); *H03F 2200/102* (2013.01);
(Continued)

(58) Field of Classification Search
CPC ....... H04B 1/0475; H04B 1/0483; H04B 1/10; H04B 15/02; H04B 1/005; H04B 1/109; H04B 2201/70707; H04B 7/0417
USPC .......................................... 375/355; 370/503
See application file for complete search history.

(56) References Cited

U.S. PATENT DOCUMENTS 5,574,992 A * 11/1996 Cygan ................... H03F 1/3247
330/129
6,307,413 B1 * 10/2001 Dalmia ................... H03L 7/087
327/150
(Continued)

FOREIGN PATENT DOCUMENTS

GB          2505471 A      3/2014

OTHER PUBLICATIONS

Non Final Office Action Dated Jan. 8, 2016 U.S. Appl. No. 14/619,425.
(Continued)

*Primary Examiner* — Daniel Washburn
*Assistant Examiner* — Sarah Hassan
(74) *Attorney, Agent, or Firm* — Eschweiler & Associates, LLC

(57) ABSTRACT

Compensation for one or more effects of impedance mismatch between a power amplifier (PA) and at least one filter is discussed. One example system that compensates for impedance mismatch with at least one filter comprises a PA, a measurement component, and a feedback component. The PA is configured to receive PA stimuli comprising a supply voltage and a radio frequency (RF) signal to be amplified, wherein a PA output is configured to be coupled to the at least one filter. The measurement component is coupled to the PA and configured to measure an output signal from the PA, wherein the output signal comprises a forward signal associated with the PA and a reflected signal associated with the at least one filter. The feedback component is configured to receive the output signal and to adjust one or more of the PA stimuli based at least in part on the output signal.

25 Claims, 16 Drawing Sheets

(51) Int. Cl.
- *H03F 1/02* (2006.01)
- *H03F 1/30* (2006.01)
- *H03F 1/32* (2006.01)
- *H03F 1/56* (2006.01)
- *H03F 3/195* (2006.01)
- *H03F 3/24* (2006.01)

(52) U.S. Cl.
CPC .. *H03F 2200/222* (2013.01); *H03F 2200/336* (2013.01); *H03F 2200/387* (2013.01); *H03F 2200/405* (2013.01); *H03F 2200/447* (2013.01); *H04B 2001/0408* (2013.01)

(56) References Cited

U.S. PATENT DOCUMENTS

| | | | |
|---|---|---|---|
| 6,683,930 B1 * | 1/2004 | Dalmia | H03D 13/004 |
| | | | 375/373 |
| 7,602,244 B1 | 10/2009 | Holmes et al. | |
| 8,605,774 B2 | 12/2013 | Rupp et al. | |
| 8,669,811 B2 | 3/2014 | Le Gallou et al. | |
| 8,718,579 B2 * | 5/2014 | Drogi | H04B 1/0475 |
| | | | 375/296 |
| 2002/0163984 A1 * | 11/2002 | Katzman | H04L 7/033 |
| | | | 375/355 |
| 2004/0114632 A1 * | 6/2004 | Yuuki | H03L 7/0814 |
| | | | 370/503 |
| 2005/0079835 A1 | 4/2005 | Takabayashi et al. | |
| 2005/0135523 A1 * | 6/2005 | Carballo | H03L 7/0802 |
| | | | 375/354 |
| 2006/0045224 A1 * | 3/2006 | Cranford, Jr. | H04L 7/0337 |
| | | | 375/355 |
| 2006/0234652 A1 | 10/2006 | Oka | |
| 2007/0081618 A1 * | 4/2007 | Jeon | H03L 7/087 |
| | | | 375/360 |
| 2009/0263265 A1 * | 10/2009 | Mathijssen | F04D 17/122 |
| | | | 418/83 |
| 2010/0027445 A1 | 2/2010 | Matsuura | |
| 2012/0223777 A1 | 9/2012 | Drogi et al. | |
| 2013/0027129 A1 | 1/2013 | Langer | |
| 2013/0034139 A1 | 2/2013 | Khlat et al. | |
| 2013/0076418 A1 | 3/2013 | Belitzer et al. | |
| 2013/0109441 A1 | 5/2013 | Lorenz et al. | |
| 2013/0231069 A1 | 9/2013 | Drogi et al. | |
| 2014/0070787 A1 | 3/2014 | Arno | |
| 2014/0106690 A1 | 4/2014 | Nentwig | |
| 2015/0035606 A1 * | 2/2015 | Bartram | H03F 1/0222 |
| | | | 330/297 |
| 2015/0072632 A1 | 3/2015 | Pourkhaatoun et al. | |
| 2015/0111511 A1 | 4/2015 | Yamanouchi | |

OTHER PUBLICATIONS

English translation of German Office Action dated Dec. 15, 2014 for copending German Application No. 10 2014 104 371.5.
U.S. Appl. No. 14/611,409, filed Feb. 2, 2015.
U.S. Appl. No. 14/619,425, filed Feb. 2, 2015.
English translation of German Office Action dated Aug. 25, 2014 for copending German Application No. 10 2014 104 372.3.
Open-ET Alliance. "Understanding the Technology That's Empowering Efficient Transmitters"; Published in 2011, Retrieved from http://www.open-et.org/intro-to-et-pa-712.php?c=1.
Non Final Office Action Dated May 19, 2015 U.S. Appl. No. 14/611,409.
Notice of Allowance Dated Sep. 1, 2015 U.S. Appl. No. 14/611,409.
European Search Report dated Jun. 23, 2016 for EP Application No. 16154579.3.
Notice of Allowance Dated May 25, 2016 U.S. Appl. No. 14/619,425.

* cited by examiner

ADJUSTING POWER AMPLIFIER STIMULI BASED ON OUTPUT SIGNALS

FIELD

The present disclosure relates to adjusting power amplifier stimuli (e.g., input signal, supply voltage, etc.) based on power amplifier output signals to filters (e.g., of a duplexer, etc.), and to applications including envelope tracking and digital pre-distortion.

BACKGROUND

An efficient way to optimize the power amplifier (PA) current consumption in a wireless system across the entire output power range is the use of a DC-DC converter to provide a variable PA supply voltage to a PA. Depending on the RF output power, for example, the output voltage of the DC-DC converter to the PA is adjusted. As the output power lowers, the PA supply voltage to the PA also lowers as a result. Due to a voltage conversion from the battery voltage down to the lower PA supply voltage, the battery current is reduced. Alternatively, the DC-DC converter output voltage can be fixed based on the target RF power (average RF power), which is expected in a next period of time. This procedure is sometimes called average power tracking (APT), in which a constant voltage is supplied to the PA.

Envelope tracking DC-DC (ET DC-DC) converters or envelope tracking modulators are capable of envelope tracking to further reduce the battery current in various situations. Envelope tracking describes an approach to RF amplifier operation, for example, in which the power supply voltage applied to the power amplifier is constantly adjusted to ensure that the amplifier is operating at or close to peak efficiency for the given instantaneous output power requirements.

A feature of envelope tracking is that the supply voltage of the power amplifier is not constant. The supply voltage of the power amplifier depends on the instantaneous envelope of the modulated baseband signal or radio frequency (RF) input signal, which is input into the PA. For example, an ET DC-DC converter follows the instantaneous envelope of the RF signal, which removes the voltage headroom and further increases the system efficiency (composite efficiency of the power amplifier and the DC-DC converter). An ET DC-DC converter, for example, can reduce the battery current of a Long Term Evolution (LTE) signal by roughly 20+% at maximum output power relative to a standard DC-DC converter, which simply follows an average power or a constant power supply.

DETAILED DESCRIPTION

Figure 1:
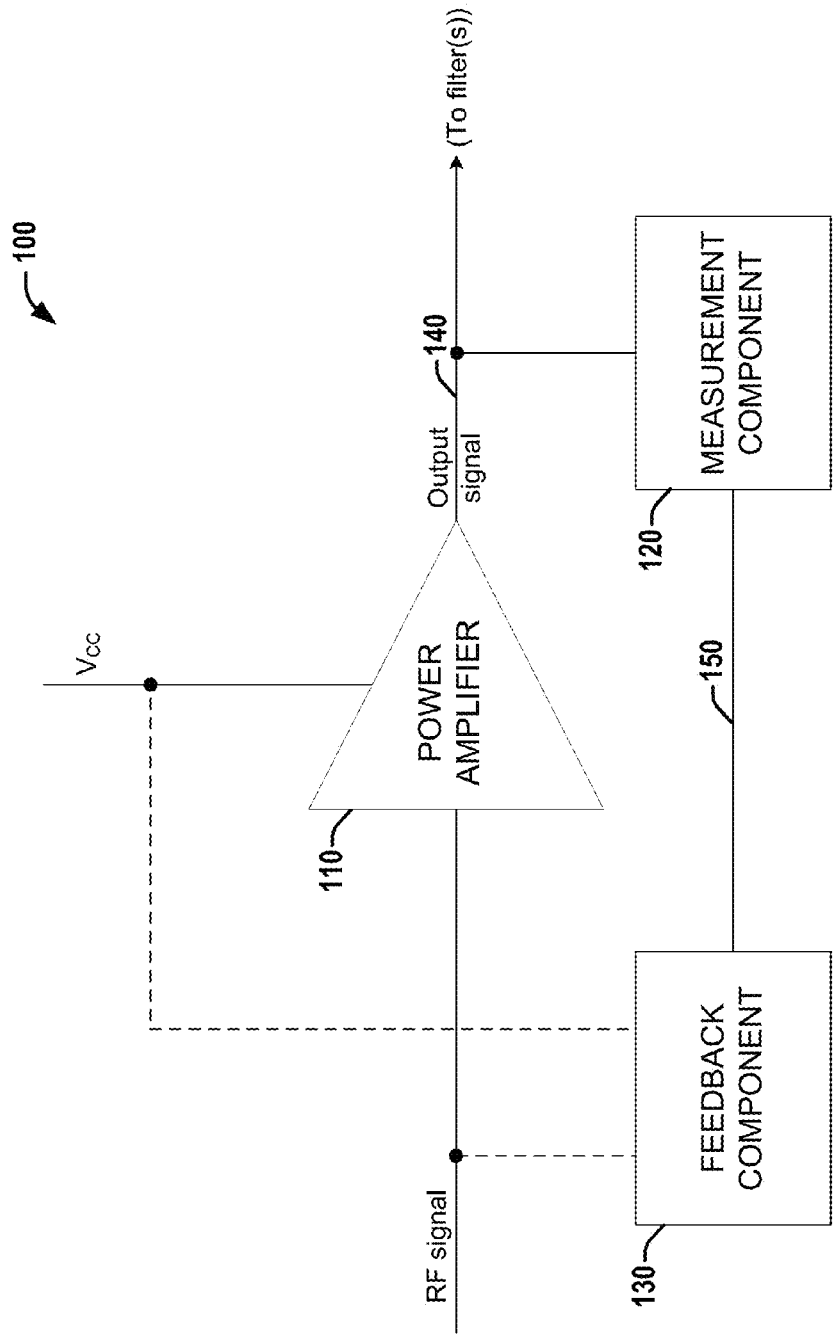
FIG. 1 is a block diagram illustrating a system or device that facilitates compensation for one or more effects of an impedance mismatch between a power amplifier (PA) and at least one filter according to various aspects described herein.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more." Similarly, a subset of a set can be described herein, in which the term "subset" can be interpreted as "one or more" elements of the set (e.g., the set itself or a proper subset).

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

One significant challenge of envelope tracking (ET) is a tight time synchronization of the radio frequency (RF) envelope and the instantaneous power amplifier (PA) supply voltage, which is a function of the instantaneous RF envelope. For example, for long term evolution frequency band 20 (LTE-20), the delay accuracy is about 1 ns. If this delay accuracy is violated, the adjacent channel leakage ratio (ACLR) performance is degraded and memory effects are introduced in the transmit chain.

The delay between the RF envelope and the instantaneous PA supply voltage depends on many contributions, for example, delay in the RF signal path, delay in the ET signal path, delay in the ET DC-DC converter (or tracker), etc. These contributions can be captured by factory calibration to account for sample variations and temperature compensation to account for a delay drift over temperature.

The delay between the RF envelope and the instantaneous PA supply voltage is referred to herein as "ET delay." The ET delay is distinct from the RF group delay, which is caused by a frequency dependent phase shift, $\sim\Delta(\text{phase})/\Delta(\text{frequency})$, introducing an offset delay in the RF envelope.

In an ideal case, the ET delay would be zero, meaning perfect synchronization between the RF envelope and the instantaneous PA supply voltage. The ET delay should be zero at the point where the RF envelope and instantaneous PA supply voltage are combined, for example, at the collector or drain of the final stage of the PA, etc.

ET signal chains can include a delay element to adjust the delay of the ET path. Ideally, the delay element would be able to change the delay of the instantaneous PA supply voltage (the delay of the ET path) until the ET delay is zero.

However, the interaction between a filter (for example, the transmit filter of a duplexer) and a power amplifier (PA) has a significant impact on PA behavior. A duplexer is essentially an implementation of multiple filters: at least one receive (RX) filter and at least one transmit (TX) filter combined by means of a phase shifter. Each of these filters can include multiple resonators to achieve the appropriate filter characteristics.

If the PA is loaded by a duplexer or similar element (e.g., a bandpass filter employed in conjunction with a time division duplexing (TDD) transmission mode, etc.) providing a load impedance with a rapidly changing phase and magnitude across frequency, the delay of the RF envelope will depend on the transmit frequency. In addition to frequency-dependent delay on the ET path, gain will also depend on transmit frequency, and amplitude-to-amplitude distortion (AMAM) and amplitude-to-phase distortion (AMPM) response can become clouded, meaning that the AMAM and AMPM responses will be split into multiple responses, depending on the instantaneous frequency of the envelope. It is also possible for these characteristics (e.g., delay of the ET path, etc.) to change within the modulation bandwidth, resulting in an ET delay mismatch that depends on the instantaneous modulation frequency. These effects cannot be easily corrected by conventional methods and apparatuses.

The frequency-dependent delay of the RF envelope (i.e., of the ET path) is referred to herein as "delay dispersion." The delay dispersion is caused by a harmful interaction between the filter (e.g., of a duplexer) and the ET system (e.g., including the PA and the ET DC-DC converter). This interaction is caused in part by an impedance mismatch between the PA and the filter.

The delay dispersion arising from the interaction between the filter (e.g., of a duplexer) and PA was not anticipated or addressed by conventional systems, and is a fundamental effect in the field of envelope tracking with significant impact.

The optimum delay setting of a PA supply voltage can be determined during factory calibration for 50 Ohm antenna conditions, which roughly corresponds to 30 dB return loss (RL). During operation, however, the system will be loaded by an antenna that causes a mismatch. As discussed in greater detail below in connection with FIGS. 9-11, the RF envelope delay over frequency heavily changes compared to the 30 dB RL case applied during factory calibration. As a result, there can be a significant ET delay error degrading the performance of the ET system when operating with a real antenna. This can result in ACLR performance degradation (e.g., more than 10 dB degradation can be observed for an antenna with a voltage standing wave ratio (VSWR) of 3:1, which corresponds to a 6 dB return loss), or transmit (Tx) noise in the receive (Rx) band can increase, lowering Rx reference sensitivity.

The measurement of the RF envelope delay during operation is very difficult. A sub-optimal delay can introduce a memory effect in the Tx chain, which can degrade linearity and may cause an asymmetric spectrum. However, there are multiple potential causes for ACLR degradation, thus ACLR performance alone is not necessarily a clear indicator for bad ET delay synchronization. Furthermore it does not tell whether the delay in the ET branch was set to a too high or too low value, so there is need for an enhancement that allows determination of the sign of the delay de-synchronization.

Systems, methods, and apparatuses discussed herein can facilitate adjustment of PA stimuli based on a PA output signal to at least one filter (e.g., of a duplexer, etc.), for example, to optimize a delay of the ET path, e.g., to zero the ET delay.

Additionally, systems, methods, and apparatuses discussed herein can facilitate adjustment of PA stimuli based on a PA output signal to at least one filter, wherein the adjustment of PA stimuli can be employed for other purposes, for example, for digital pre-distortion (DPD).

An example DPD system employs a coupler to sense a portion of the PA output signal after the duplexer in a Tx chain. This signal can be processed by a feedback receiver (FBR) that can employ in-phase (I) and quadrature (Q) signal demodulation, scaling, and analog-to-digital (AD) conversion. In one example DPD technique, the distortion can be approximated (e.g., by estimating the AMAM and AMPM response and approximating these with polynomials), and the approximated distortion can be used to calculate the pre-distortion characteristic for the amplitude and phase of the RF signal. There are many other potential techniques for deriving and applying the pre-distortion characteristic. However, because in conventional systems the Tx signal is sensed after the Tx filter (e.g., of the duplexer), the Tx filter is part of the feedback loop, and thus all conventional DPD systems suffer from the same two problems. First, the filter causes a strong group delay which changes with frequency and temperature, leading to complex time alignment. Second, at the band edges, the filter skirts cut part of the distorted Tx spectrum which is needed for pre-distortion, causing the spectrum to become asymmetric, which introduces severe memory effects.

As mentioned, filtering can cause asymmetries in the spectrum, such as the upper side of the spectrum being suppressed. This suppressed spectrum content includes distortions due to PA non-linearity. Without filtering, AMAM and AMPM response is extremely tight, but can become significantly clouded with filtering, particularly near band edges. The effects of filters on AMAM and AMPM response is discussed in greater detail below in connection with FIGS. 12-14. Filtering introduces a memory effect in the feedback loop, which can complicate (or even render impossible) estimation of AMAM response and AMPM response.

Due to these negative effects, sensing the Tx signal after Tx filtering, as done in conventional DPD systems, is poorly suited for DPD. However, using a coupler between the PA and Tx filter instead of after the Tx filter can negatively affect output power setting. The sensed signal of the coupler is used to set the output power to the proper levels, and using a sensed signal from before the Tx filter will reduce the accuracy of output power setting, because the Tx filter also affects the output power. On the other hand, using a second coupler (with one between the PA and the filter(s), and one after the filter(s)) will increase Tx losses, and (especially in multi-band devices) may be impractical due to complications from increased size, cost, RF routing, and connections to a feedback receiver. However, systems, methods and apparatuses discussed herein can facilitate DPD based on an output signal from the PA to the Tx filter(s) while avoiding these drawbacks.

Referring to FIG. 1, illustrated is a block diagram of a system or device 100 that facilitates compensation for one or more effects of an impedance mismatch between a power amplifier (PA) 110 and at least one filter. System 100 includes the PA 110, a measurement component 120, and a feedback component 130. System 100 can be included, for example, in the transmit (Tx) chain of a wireless device such as a user equipment (UE).

PA 110 is configured to receive a plurality of PA stimuli that include a radio frequency (RF) signal and a supply voltage (Vcc) and to amplify the RF signal. The PA 110 is configured to output the amplified RF signal to at least one filter (e.g., a Tx filter of a duplexer, etc.), which is not shown. However, due to an impedance mismatch between the PA and the at least one filter, the output signal 140 of the PA 110 will include both a forward signal associated with the PA and a reflected signal associated with the at least one filter. Output signal 140 can be, for example, a voltage, current, etc. at an output terminal of PA 110, such as a collector or a drain (which can be from a final stage in a multi-stage amplifier).

The measurement component 120 is coupled to the PA 110, and is configured to measure the output signal 140. Measurement component 120 can measure output signal 140 via high impedance coupling to the output terminal of the PA such as a resistive or capacitive voltage divider, a dedicated amplifier, etc. Measurement component 120 is further configured to provide a measured output signal 150 to feedback component 130.

Feedback component 130 is configured to receive the measured output signal 150 from measurement component 120, and to adjust one or more of the PA stimuli (e.g., input RF signal, supply voltage, etc.) based on the measured output signal 150 (and thus based on the output signal 140). For example, in ET applications, feedback component 130 can adjust a delay of an ET path associated with the supply voltage so that it better matches the instantaneous envelope of the input RF signal based on current operating conditions. In another example, in DPD applications, feedback component 130 can digitally pre-distort the input RF signal based on output signal 140. In various embodiments, feedback component 130 can comprise one or more components that facilitate optimization of the delay of the ET path, one or more components that facilitate DPD of the input RF signal, and/or one or more additional components for other applications.

Because measurement component 120 is configured to measure the output signal 140 between the PA 110 and the at least one filter, output signal 140 includes the forward signal and the reflected signal.

Thus, relevant to ET applications discussed herein, the output signal 140 (and measured output signal 150) includes the effect on envelope delay from the reflected signal, which is not included in a signal obtained from after the at least one filter on the Tx chain (e.g., obtained via the coupler in conventional systems, etc.). The envelope delay is impaired by the reflected signal arriving at the output terminal of PA 110. The RF voltage of the output signal 140 is the sum of the forward signal and the reflected signal (multiplied by the square root of a reference impedance, e.g., 50 Ohms), and therefore includes the effect on envelope delay from the reflected signal, which a pure forward signal would not have. In ET applications, feedback component 130 can extract an envelope from measured output signal 150 (thus determining an envelope of output signal 140) to compare with a reference envelope from an ET signal chain. Based on the comparison, feedback component 130 can determine a correction value (e.g., adjustment for the delay of the ET path, and the delay of the ET path can be adjusted based on the correction value to re-optimize the delay of the ET path during operation (e.g., return the ET delay to zero or to within a threshold value of zero; for example, for LTE-20, an example threshold of about 1 ns or less can be employed).

For example, during an initial (e.g., factory) calibration, an optimal adjustment of the delay of the ET path can be determined. While the optimal delay of the ET path is determined, feedback component 130 can determine a target delay as a difference between measured output signal 150 (and thus the output signal 140 as measured by measurement component 120) and a reference signal from an ET path. The target delay can be stored (e.g., by feedback component 130) for later use. During operation, a delay between the output signal 140 relative to the reference signal from the ET path can again be determined by feedback component 130. In general, due to operating conditions, this delay will differ from the target delay. Feedback component 130 can compare the delay of the output signal 140 to the target delay, and can adjust the delay of the ET path until the delay of the output signal 140 relative to the reference signal becomes the target delay (or is sufficiently close to the target delay, e.g., within a threshold difference). Thus, the ET delay can be returned to zero (or to within a threshold value of zero). An example embodiment of feedback component 130 configured to perform the above is discussed infra, in connection with FIG. 5.

Embodiments described herein can optimize the delay of the ET path during operation by directly measuring the delay of the ET path or deviation from an optimum delay, in contrast to some conventional techniques that can require significant amounts of post-processing and may function poorly when there is a significant delay mismatch between the supply voltage and the instantaneous envelope of the RF signal.

Relevant to DPD applications discussed herein, the output signal measured between the PA 110 and the at least one filter includes all the information necessary for DPD, without the filtering and group delay effects in conventional systems.

Figure 2:
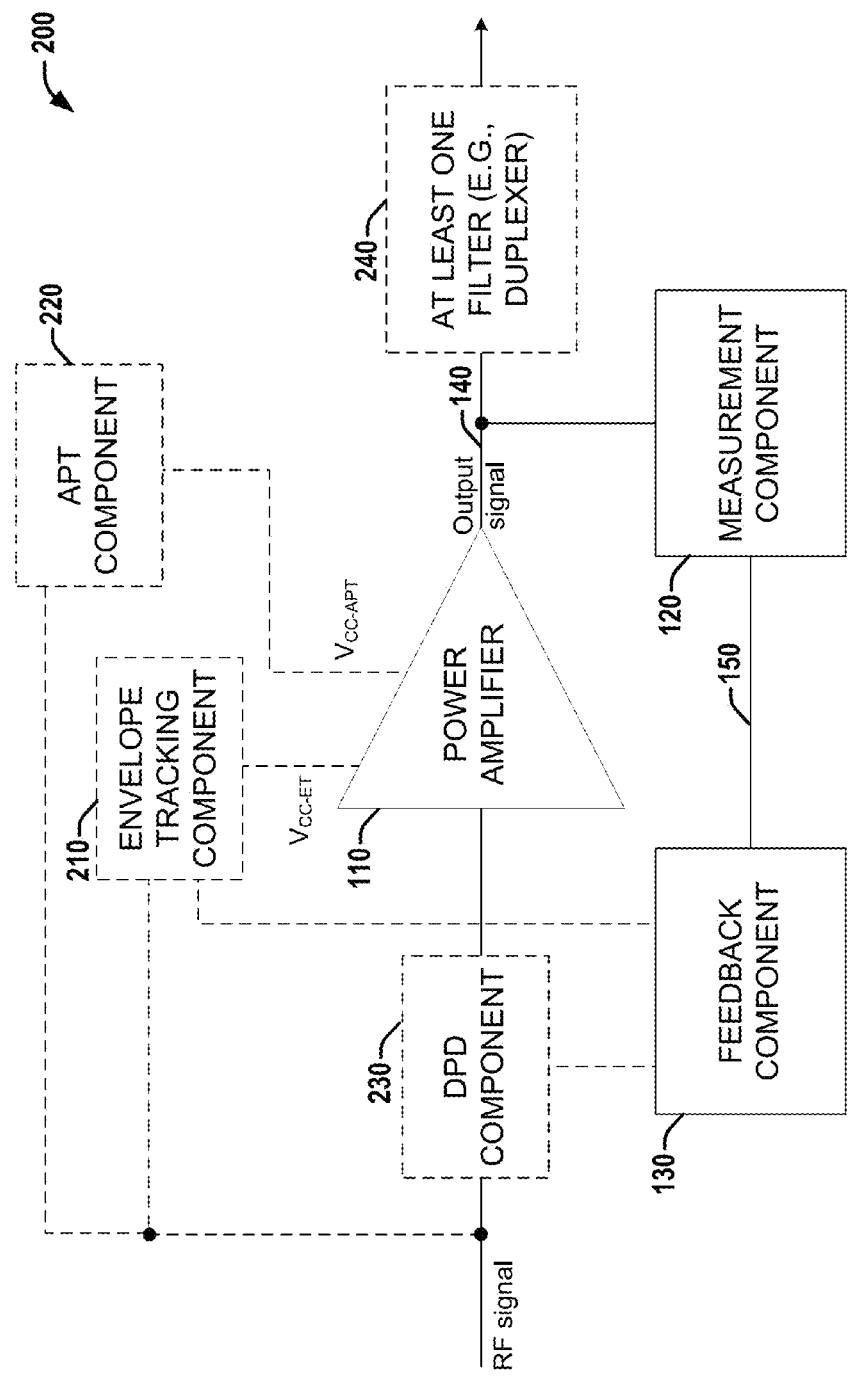
FIG. 2 is a block diagram illustrating another system or device that facilitates compensation for one or more effects of an impedance mismatch between a PA and at least one filter and includes one or more optional components according to various aspects described herein.

Referring to FIG. 2, illustrated is a block diagram of a system or device 200 that facilitates compensation for one or more effects of an impedance mismatch between a PA 110 and at least one filter 240 and includes one or more optional components according to various aspects described herein. System 200 includes PA 110, measurement component 120, and feedback component 130, which are configured and can operate as described elsewhere herein. Additionally, system 200 can include one or more of ET component 210, DPD component 230, at least one filter 240 (e.g., of a duplexer, etc.), and average power tracking (APT) component 220. PA 110, measurement component 120, and feedback component 130 can be configured to operate as described in connection with FIG. 1.

ET component 210 can optionally be included and is configured to provide the supply voltage ($V_{CC-ET}$) to the PA 110. ET component 210 is configured to provide a supply voltage that depends upon the envelope of the RF signal in accordance with a delay of the ET path to compensate for the differing delays on the two signal paths (i.e., the main signal path from RF signal generation to the PA, and the ET path through ET component 210). In some aspects, this can include the supply voltage tracking the instantaneous envelope of the RF signal, but it can also include aspects wherein not just the instantaneous envelope is considered (e.g., to combat memory effects, the supply voltage can depend on previous or later samples of the envelope), and the envelope need not be directly tracked (e.g., only tracked down to a minimum level, for example, to avoid non-linear behavior or because power consumption is already low enough). Envelope tracking and example sub-components of an ET component 210 are discussed in greater detail infra, for example, in connection with FIGS. 5 and 16.

APT component 220 can optionally be included and is configured to provide the supply voltage ($V_{CC-APT}$) to the PA 110 according to an APT mode that approximates an average power expected in a next period of time.

In various embodiments, ET component 210 can be included, APT component 220 can be included, or both can be included in system 200. When both ET component 210 and APT component 220 are included in system 200, ET component 210 can provide the supply voltage in some situations, and APT component 220 can provide the supply voltage in other situations. For example, feedback component 130 can determine a level of distortion associated with the output signal 140 based on analysis of measured output signal 150. If the level of distortion exceeds a threshold value, APT component 220 can provide the supply voltage. On the other hand, if the level of distortion does not exceed the threshold value, ET component 210 can provide the supply voltage. Additionally or alternatively, in embodiments with ET component 210 (whether or not APT component 220 is included), if the level of distortion exceeds the threshold value, a different transmit antenna can be employed if system 200 is included in a device with antenna swapping, ET component 210 can increase a power of the supply voltage to reduce distortion. In general, when the level of distortion exceeds the threshold value, one or more of the above techniques can be employed where applicable.

DPD component 230 can optionally be included and is configured to receive the input RF signal and the measured output signal 150. Based on the measured output signal 150, DPD component 230 is configured to determine a distortion associated with the output signal 140, and to digitally pre-distort the input RF signal. By digitally pre-distorting the input RF signal, distortion caused later in the main signal path (e.g., by PA 110) can be compensated for in whole or in part, producing an output signal 140 with less distortion. Although shown in system 200 as a separate component from feedback component 130, DPD component 230 can be included in feedback component 130. Digital pre-distortion and example sub-components of a DPD component 230 are discussed in greater detail infra, for example, in connection with FIG. 6.

At least one filter 240 can optionally be included and is configured to filter the output signal 140. The at least one filter 240 can include one or more bandpass filters, and can be, for example, included within a duplexer comprising a Tx bandpass filter and a Rx bandpass filter. Due to operating conditions (e.g., temperature, operating frequency band, operating frequencies within that band, etc.), even with a matching network (not shown), there will in general be an impedance mismatch between PA 110 and the at least one filter 240, which will cause output signal 140 to comprise both a forward signal associated with PA 110 and a reflected signal associated with the at least one filter 240. Although the at least one filter 240 can be included in system 200, it need not be included in system 200, as system 200 can be provided as a "stand-alone" system that can operate in connection with a separate at least one filter, which could be substituted for a different at least one filter, for example.

Figure 3:
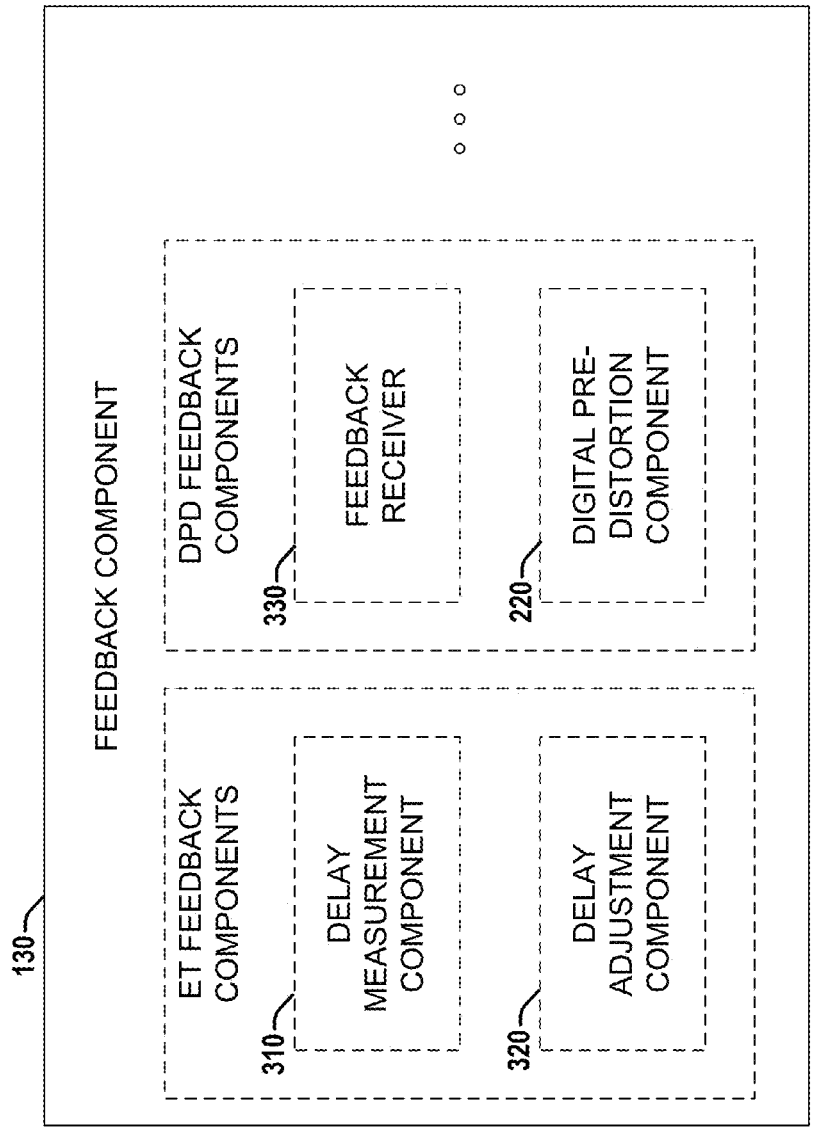
FIG. 3 is a block diagram illustrating example components that can be included in a feedback component according to various aspects described herein.

Referring to FIG. 3, illustrated is a block diagram showing example components that can be included in a feedback component 130 according to various aspects described herein. Depending on the embodiment, for example, the application or applications for which the measured output voltage 150 will be used, feedback component 130 can include components for adjusting a delay of the ET path such as delay measurement component 310 and/or delay adjustment component 320, components for digitally pre-distorting an input RF signal such as feedback receiver 330 and/or DPD component 220, and/or additional components for other applications, as indicated by the ellipsis in FIG. 3.

When included, delay measurement component 310 is configured to determine the delay of the output signal 140 (from measured output signal 150) relative to a reference signal (e.g., from an ET path). For example, delay measurement component 310 can determine an envelope associated with the output signal 140, which can be normalized and compared with an envelope of the reference signal to determine the delay of the output signal 140 relative to the reference signal.

When included, delay adjustment component 320 is configured to adjust the delay of the ET path based on the delay of the output signal 140. For example, delay adjustment component 320 can compare the delay of the output signal 140 to a target delay (e.g., which can be determined by delay adjustment component 320 during an initial calibration, as described elsewhere herein), and adjust the delay of the ET path until the delay of the output signal 140 (e.g., relative to the delay of the ET path) equals the target delay (or is sufficiently close to the target delay, e.g., within a threshold difference of the target delay).

When included, feedback receiver 330 is configured to receive the measured output signal 150 and to perform some signal processing on measured output signal 150, such as IQ demodulation, scaling, and AD conversion.

When included, DPD component 220 is configured to calculate a pre-distortion characteristic to apply to the input RF signal (e.g., by estimating the distortion, such as via polynomials, for amplitude and phase of the RF signal, etc.) based on the measured output signal 150, and to apply the pre-distortion characteristic to digitally pre-distort the input RF signal.

Figure 4:
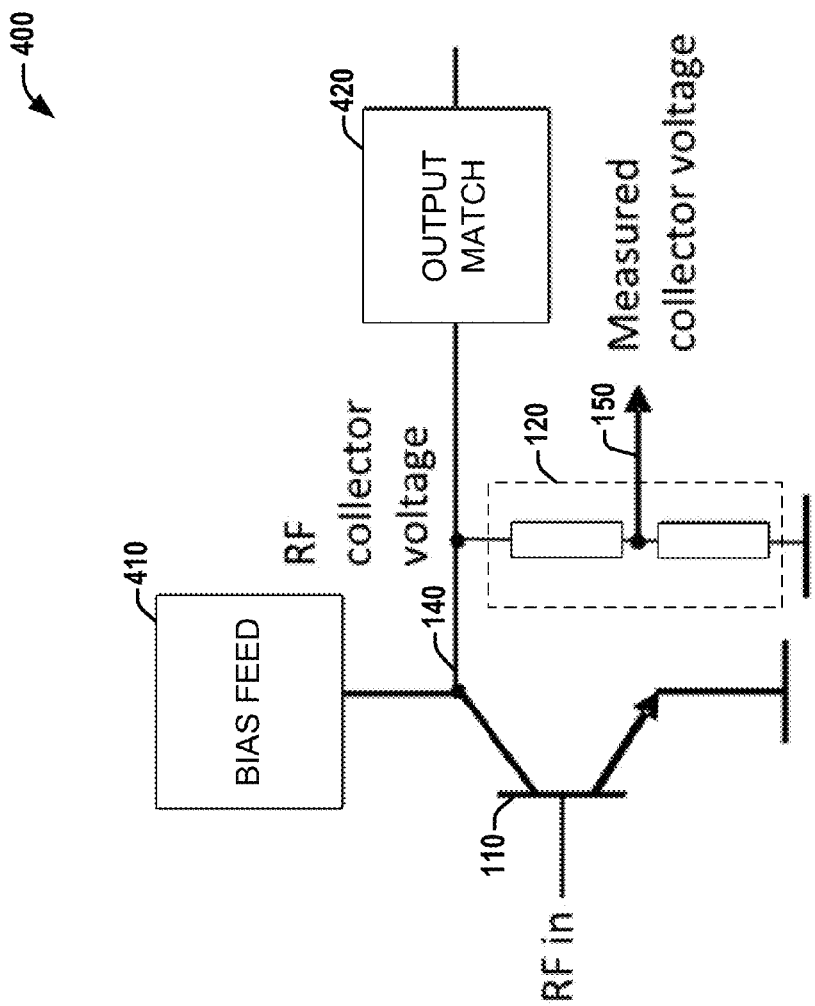
FIG. 4 is a block diagram illustrating an example embodiment of a system or device that facilitates measurement of an output signal of a PA according to various aspects described herein.

Referring to FIG. 4, illustrated is an example embodiment of a system or device 400 (e.g., on a PA die) that facilitates measurement of an output signal of a PA 110 according to various aspects described herein. System 400 includes the PA 110 configured to output the output signal 140, the measurement component 120, a bias feed 410 configured to provide a DC bias to the PA 110, and an output matching network 420 configured to impedance match the PA 110 with the at least one filter.

In the example embodiment of FIG. 4, the PA 110 is shown (for ease of illustration) as a single-stage bipolar junction transistor (BJT) amplifier, although in various embodiments, PA 110 can comprise one or more field-effect transistors (FETs), one or more BJTs, or a combination thereof, and can be a single-stage or multi-stage amplifier. As shown in the embodiment of FIG. 4, the output voltage 140 is the RF collector voltage, although this can vary; for example, in FET embodiments, the output voltage 140 can be a drain voltage.

Measurement component 120 shown in FIG. 4 is an example embodiment of a measurement component comprising a high impedance resistive voltage divider. In various embodiments, however, measurement component 120 can comprise any of a variety of components capable of measuring output voltage 140, such as a resistive or capacitive voltage divider, dedicated amplifier, etc. As shown in FIG. 4, measurement component 120 can measure output voltage 140 before impedance matching by output matching network 420. Measurement component 120 can be implemented on the active PA die (e.g., which can be a heterojunction bipolar transistor (HBT) die, complementary metal oxide semiconductor (CMOS) die, silicon-on-insulator (SOI) die, laterally diffused metal oxide semiconductor (LDMOS) die, etc.).

Figure 5:
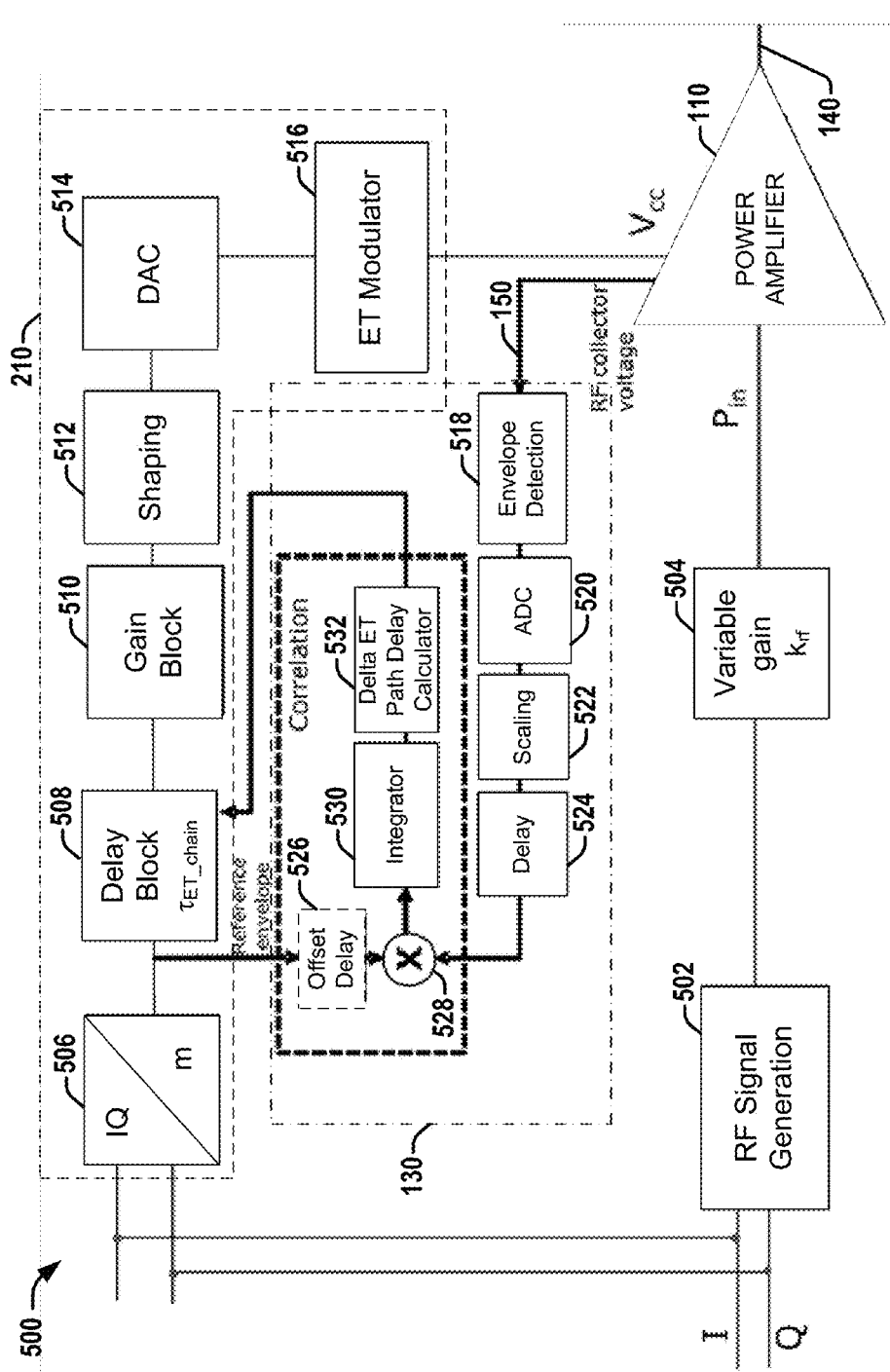
FIG. 5 is a block diagram illustrating an example embodiment of a system or device that facilitates adjustment of a delay of an envelope tracking (ET) path based on a PA output signal according to various aspects described herein.

Referring to FIG. 5, illustrated is an example embodiment of a system or device 500 that facilitates adjustment of a delay of an ET path based on an output signal 140 from a PA 110 according to various aspects described herein.

System 500 can include a main signal path that includes an RF signal generation component 502 configured to generate the input RF signal from in-phase and quadrature components, a variable gain component 504 configured to multiply the output of RF signal generation component 502 by a variable gain ($k_{RF}$) to obtain a desired gain for the main signal path, and the PA 110 configured to receive PA stimuli comprising the input RF signal with input power $P_{in}$ and a supply voltage $V_{CC}$ and to output the output signal 140 (e.g., as a collector or drain voltage, etc.).

System 500 can also include an ET component 210 on an ET path. ET component 210 can comprise a vector-to-magnitude converter 506 (e.g., implementing a CORDIC algorithm, etc.) configured to determine a magnitude of the input IQ signal as $m(I,Q)=magnitude(I+jQ)$. The envelope determined thereby (the "reference envelope") can be employed both for providing an ET power supply and for adjusting the delay of the ET path via feedback component 130. ET component 210 can also include a variable delay block 508 configured to delay the signal by an adjustable delay of the ET path $\tau_{ET\_chain}$ and one or more variable gain blocks 510 to apply a variable gain to the signal in the ET chain (e.g., based on the variable gain $k_{RF}$, etc.). ET component 210 can further comprise at least one shaping component 512 to pre-distort the envelope (e.g., by implementing a non-linear transfer function to shape the envelope, such as via a look-up table), a digital-to-analog converter (DAC) 514 configured to convert a received (shaped) digital signal to analog, and an ET modulator (DC-to-DC voltage provider, e.g., DC-DC converter) 516 configured to provide the supply voltage to the PA 110.

System 500 can further include a measurement component (not shown in FIG. 5) that can measure the output voltage 140 and a feedback component 130. Feedback component 130 can include a delay measurement component and a delay adjustment component, which can be implemented via example components 518-532. However, it is to be understood that component 518-532 show only one example implementation in which the delay of the ET path can be adjusted, although other implementations are possible and intended to be within the scope of the disclosure.

The measured output signal 150 (e.g., measured from an RF collector or drain voltage, etc.) can be provided to an envelope detector 518 configured to determine the envelope of the output signal 140. The envelope can be provided to an analog-to-digital converter (ADC) 520 to convert into a digital signal, which can then be scaled by scaling component 522. The magnitude of the envelope is not necessary for adjusting the delay of the ET path, thus scaling component 522 can normalize the magnitude of the envelope via scaling, which can reduce post-processing, such as by avoiding clipping effects. A delay adjustment block 524 is configured to align the signal delay between the envelope detection path 518-524 and the reference path through 506, and can apply a delay to align the signals from the two paths to compensate for delays from signal processing. The delay of delay adjustment block 524 can be determined during an initial calibration. Additionally or alternatively, a delay adjustment block 524 could be within the reference envelope path (the path to correlator 528 labeled "reference envelope").

Optionally, an offset delay component 526 can be included on either or both of the reference path or the envelope path to correlation block 528 (FIG. 5 shows an offset delay component 526 on the reference path). During calibration, the offset delay can be set to 0. During transmit operation, a delay offset can be programmed to generate some known delay between the reference envelope and the detected envelope. This can facilitate the correlation process, for example, by serially applying positive and negative offset delays. If the ET delay is 0, negative and positive offset delays of the same magnitude will result in the same output of the correlation process.

The correlation block 528 can combine (e.g., multiply) the detected envelope from the path 518-524 with the reference envelope. An integrator 530 can integrate the combined envelopes. Based on the outcome of the correlation and integration, a correction value for the delay of the ET path (a "delta ET path delay") can be determined by Delta ET Path Delay Calculator 532, for example, by comparison of the output value of integrator 530 with a target value (e.g., of output from integrator 530) obtained from an initial calibration. The correction value (delta ET path delay) can be provided to delay block 508, which can adjust the delay of the ET path based on the correction value. As a result, an updated value $\tau_{ET\_chain}$ for the delay of the ET path is generated that reduces or removes errors in the delay of the ET path, setting the ET delay to substantially zero. During correlation, the result may be unclear or outside an expected range, which can result from the RF envelope being heavily distorted (e.g., due to severe antenna mismatch). Severe antenna mismatch, for example, can significantly affect the optimum delay of the ET path for zero ET delay and/or the AMAM and AMPM response of the PA 110. As a result, the ACLR and/or error vector magnitude (EVM) may become corrupted, which can result in, for example, lowered data throughput or a terminated call. In such a situation, an APT mode can be implemented, the output power can be adjusted to reduce clipping effects, a different transmit antenna can be employed, or some combination of the above.

As noted supra, the delay setting of delay adjustment block 524 can be determined during an initial calibration (e.g., during ET calibration). The delay of the instantaneous PA supply voltage (delay of the ET path) can be adjusted via delay block 508 until the ET delay is zero. At that point, the RF envelope and the instantaneous PA supply voltage are synchronized. During synchronized conditions, the delay of the envelope detection path 518-524 can be adjusted via delay adjustment block 524 until the correlation block 526-532 indicate synchronization between the detected envelope and the reference envelope. The delay value to obtain synchronization can be stored as the target delay, and employed during transmit operation. When the delay of the RF envelope changes during operation, the detected envelope and the reference envelope will no longer be synchronized, which can be determined via the correlator 528.

As can be seen in FIGS. 1-5, embodiments discussed herein can include a measurement component 120 configured to measure an output signal (e.g., RF voltage) of a PA 110 at a point where the RF envelope and instantaneous supply voltage are combined (e.g., the collector or drain of the final stage of the PA 110). In ET embodiments, envelope information associated with output signal 140 can be extracted from the measured output signal 150. Additionally, a correction value for the delay of the ET path can be determined by comparing the measured envelope with a reference envelope. The determined correction value can be applied to the ET signal path to adjust the delay of the ET signal path such that the ET delay is reduced or becomes 0.

Figure 6:
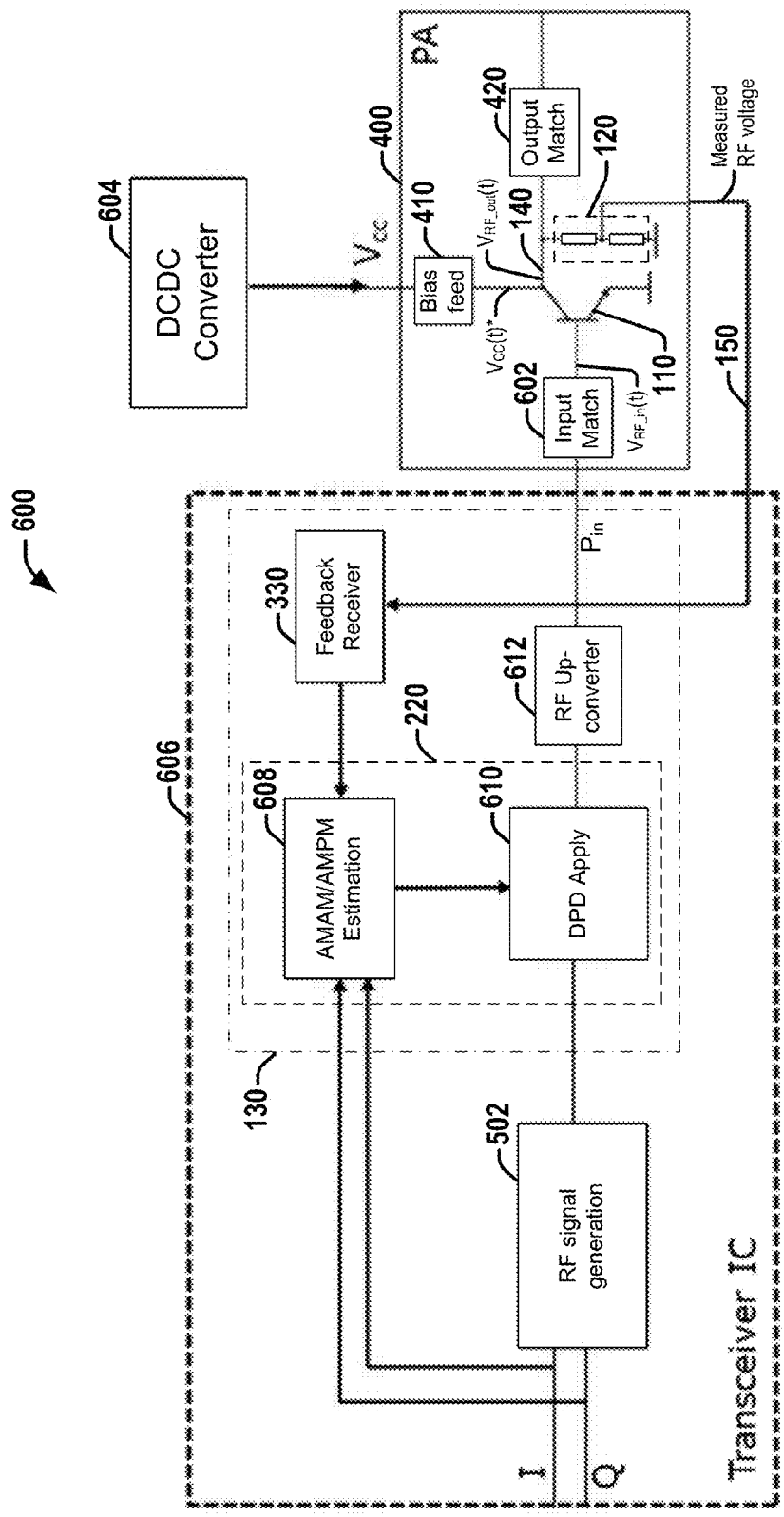
FIG. 6 is a block diagram illustrating an example embodiment of a system or device that facilitates digital pre-distortion of an input radio frequency (RF) signal based on a PA output signal according to various aspects described herein.

Referring to FIG. 6, illustrated is an example embodiment of a system or device 600 that facilitates digital pre-distortion of an input radio frequency (RF) signal based on an output signal 140 ($V_{RF\_out}(t)$) of a PA 110 according to various aspects described herein. System 600 can include a PA 110 configured to receive PA stimuli comprising an input RF signal ($V_{RF\_in}(t)$) and a supply voltage ($V_{CC}(t)^*$) and a measurement component 120, which can both be implemented on a PA die 400 with a DC bias feed component 410, output matching network 420, and input matching network 602. A DC-DC converter 604 can provide the supply voltage to the PA 100, and can provide the supply voltage according to an ET mode (e.g., as part of an ET component 210) and/or an APT mode (e.g., as part of an APT component 220). System 600 can also include an RF signal generation component 502 and a feedback component 130, which as shown in FIG. 6, can optionally be implemented on a transceiver integrated circuit (IC).

In the embodiment of system 600, feedback component 130 can comprise a feedback receiver 330 configured to receive the measured output signal 150 and to perform signal processing (e.g., IQ demodulation, scaling, AD conversion, etc.) and DPD component 220. The DPD component 220 can include a distortion estimation component 608 configured to estimate distortion associated with the output signal 140 and to determine a pre-distortion characteristic. DPD component 220 can also include a DPD application component 610 configured to apply the pre-distortion characteristic to the input RF signal to digitally pre-distort the input RF signal to compensate for distortion added later in the main signal path (e.g., by the PA 110), after which the signal can be up-converted by an RF up-converter 612 and provided to PA 110.

Embodiments discussed herein that facilitate DPD (such as that of system 600) illustrate how the sensed collector voltage can be used for DPD purposes. Instead of using the signal from a coupler, as in conventional systems, the output signal 140 (e.g., collector or drain voltage of the PA 110) can be employed. Output signal 140 includes all the information which is needed for DPD operation, but it is not corrupted by the transmit filter(s), and thus has no group delay effects or other issues caused by filtering (e.g., memory effects arising from an asymmetric spectrum). In addition, DPD embodiments discussed herein have almost no impact on size and cost, and do not increase the post-PA losses. Although the signal level at the input of the feedback component 130 (e.g., at feedback receiver 330) depends on the antenna impedance, the absolute level is not necessary for DPD, as normalization can be applied to compare the sensed signal with the reference signal.

Figure 7:
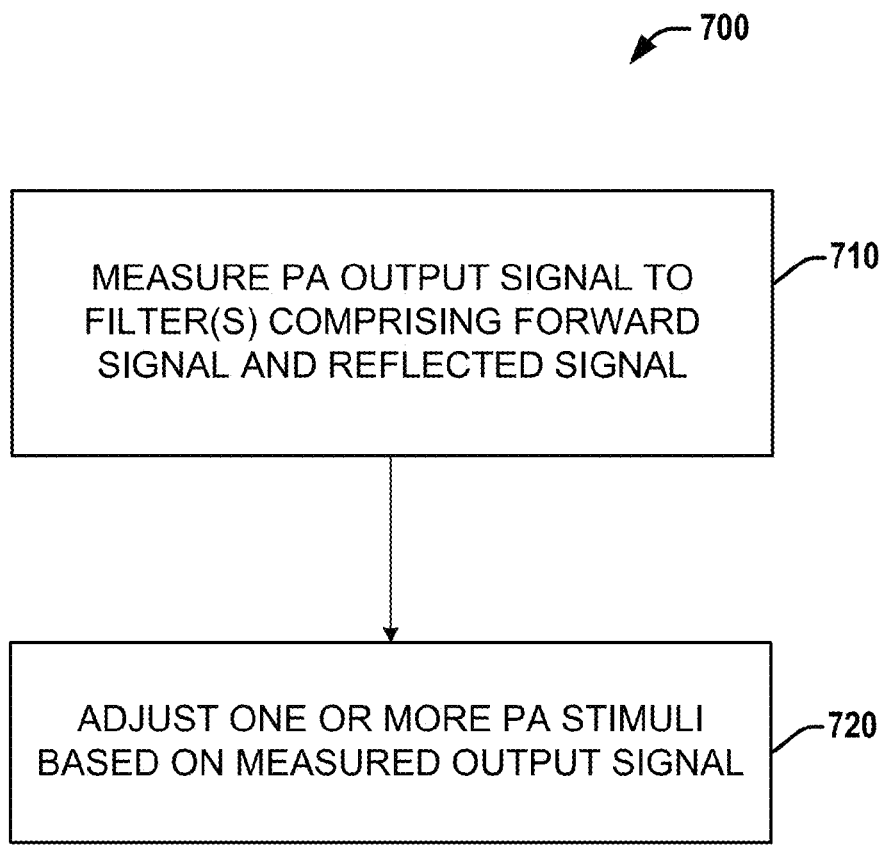
FIG. 7 is a flow diagram illustrating a method that facilitates compensation for one or more effects of an impedance mismatch between a PA and at least one filter according to various aspects described herein.

Referring to FIG. 7, illustrated is a flow diagram of a method 700 that facilitates compensation for one or more effects of an impedance mismatch between a PA and at least one filter according to various aspects described herein.

Method 700 can include, at 710, measuring an output signal of a PA that receives one or more PA stimuli, wherein the PA is coupled to at least one filter. The one or more PA stimuli can include an input RF signal and a supply voltage, and the PA can be configured to amplify the input RF signal. Because the PA is coupled to the at least one filter, the output signal comprises a forward signal (e.g., associated with the PA) and a reflected signal (e.g., associated with the at least one filter). At 720, method 700 can include adjusting one or more of the PA stimuli based at least in part on the output signal. The adjusting of 720 can include adjusting a delay of the ET path for ET delay optimization, applying DPD to an input RF signal, etc.

Figure 8:
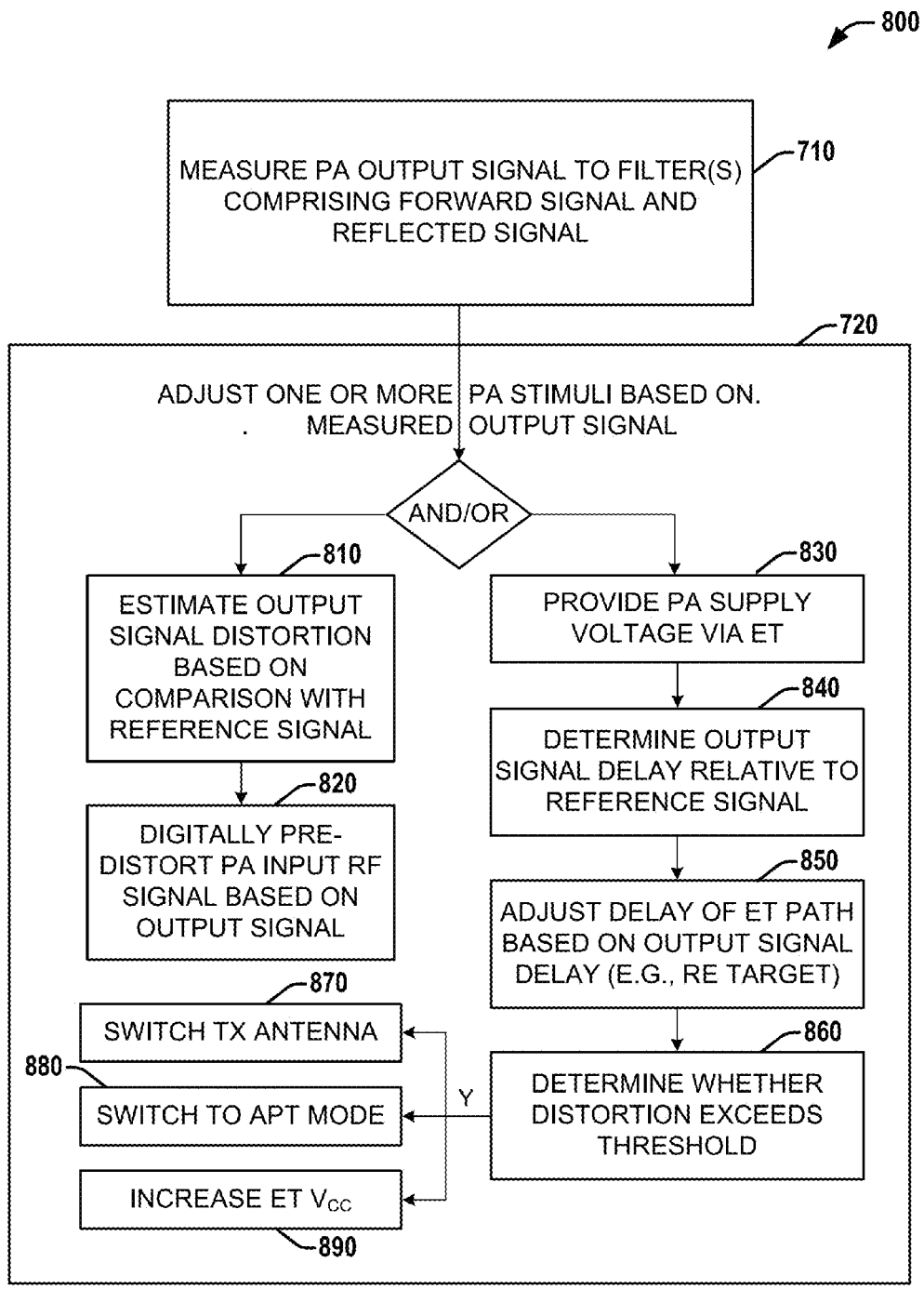
FIG. 8 is a flow diagram illustrating another method that facilitates compensation for one or more effects of an impedance mismatch between a PA and at least one filter according to various aspects described herein.

Referring to FIG. 8, illustrated is a flow diagram of another method 800 that facilitates compensation for one or more effects of an impedance mismatch between a PA and at least one filter according to various aspects described herein. Method 800 can include, at 710, measuring a PA output signal to at least one filter, wherein the PA output signal comprises a forward signal and a reflected signal, and at 720, adjusting one or more PA stimuli (e.g., input RF signal, supply voltage, etc.) of the PA based on the measured output signal.

Additionally, method 800 optionally includes one or more of 810-890, associated with DPD (at 810-820, wherein the adjusted PA stimuli include the input RF signal) and ET delay optimization (at 830-890, wherein the adjusted PA stimuli include the supply voltage).

At 810, a distortion of the measured output signal can be estimated, for example, based on a comparison with a reference signal. At 820, the input RF signal can be digitally pre-distorted based at least in part on the output signal (e.g., by determining a pre-distortion characteristic based on the distortion estimation in 810, and applying the pre-distortion characteristic to the input RF signal).

Additionally or alternatively, at 830, method 800 can include providing the PA supply voltage via an envelope tracking mode, wherein the supply voltage depends on the envelope of the input RF signal (e.g., by tracking the instantaneous envelope, or other variations discussed herein), and is based at least in part on a delay of an ET path. At 840, a delay of the output signal can be determined relative to a reference signal (e.g., from an ET path). The delay can be determined, for example, by detecting an envelope of the output signal, normalizing the envelope, and comparing the envelope of the output signal to an envelope of the reference signal (e.g., after AD conversion). At 850, the delay of the ET path can be adjusted based at least in part on the delay of the output signal (e.g., as compared with a target delay). For example, as discussed supra, the delay of the output signal can be adjusted until it reaches the target delay, which can be obtained during a calibration procedure.

Optionally, at 860, a determination can be made as to whether a level of distortion of the output signal exceeds a threshold value. If the level of distortion does exceed the threshold value, then one or more responses can be implemented. For example, as shown at 870, a different transmit antenna can be employed in a multi-antenna device. In another example, at 880, the supply voltage can be switched to be provided according to an APT mode that approximates an average power expected in a next time interval. As an additional example, at 890, a power of the ET supply voltage can be increased.

Referring to FIGS. 9-14, illustrated are graphs showing some of the effects of a coupled filter on the output signal of a PA on distortion and optimal delay of the ET path.

Figure 9:
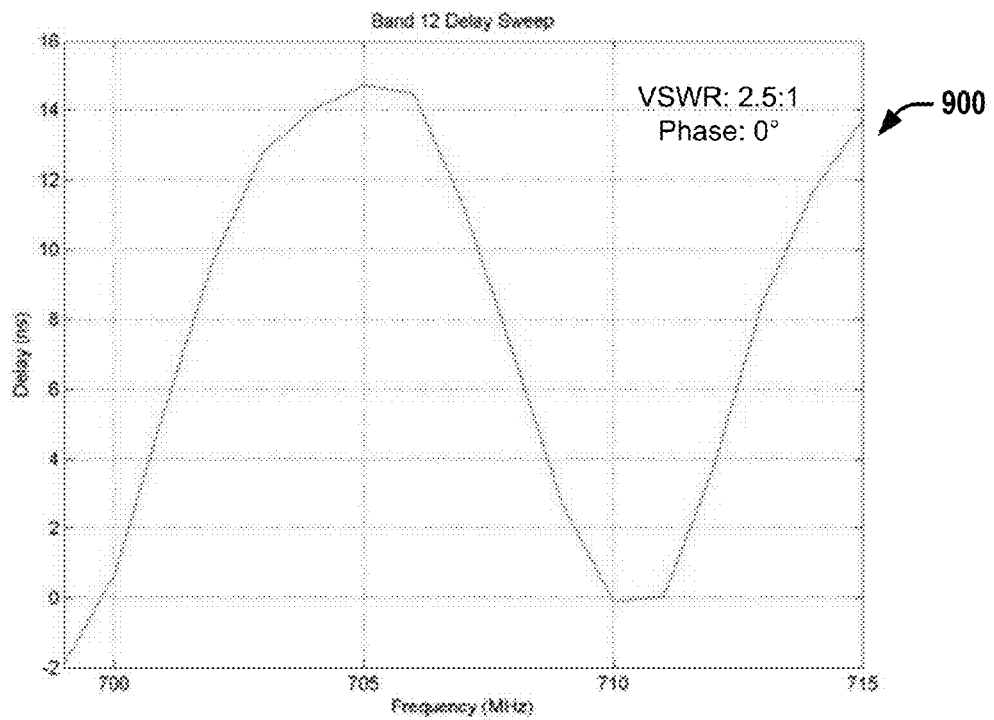
FIG. 9 is a pair of graphs illustrating the optimum delay of an ET path for a voltage standing wave ratio (VSWR) of 2.5:1 at load phases of 0° and 60°.
Figure 9:
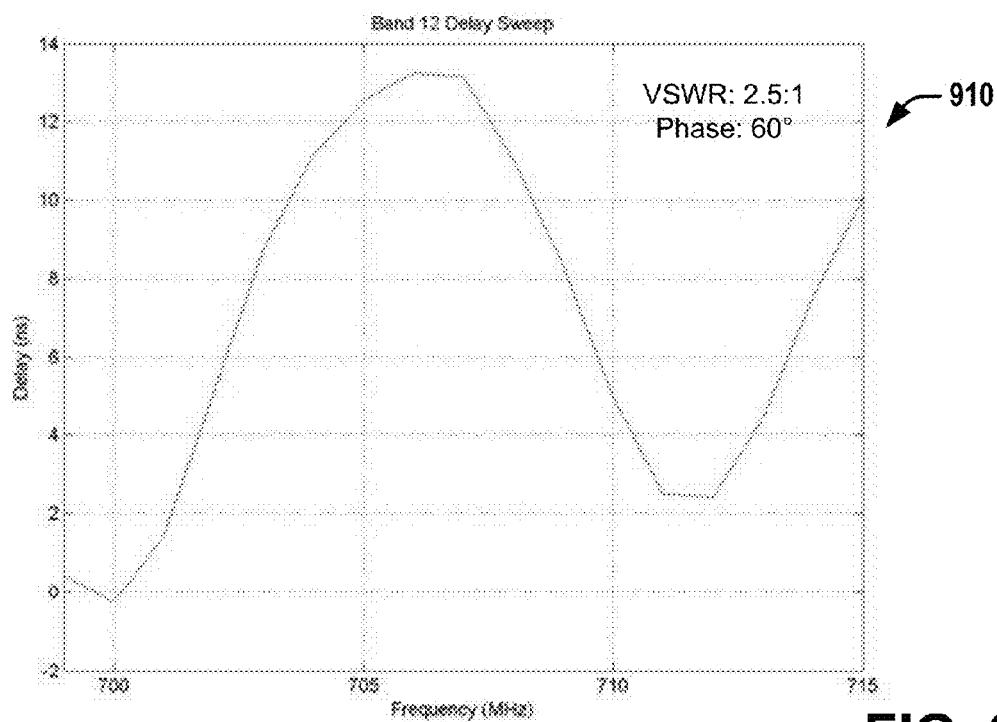
Figure 10:
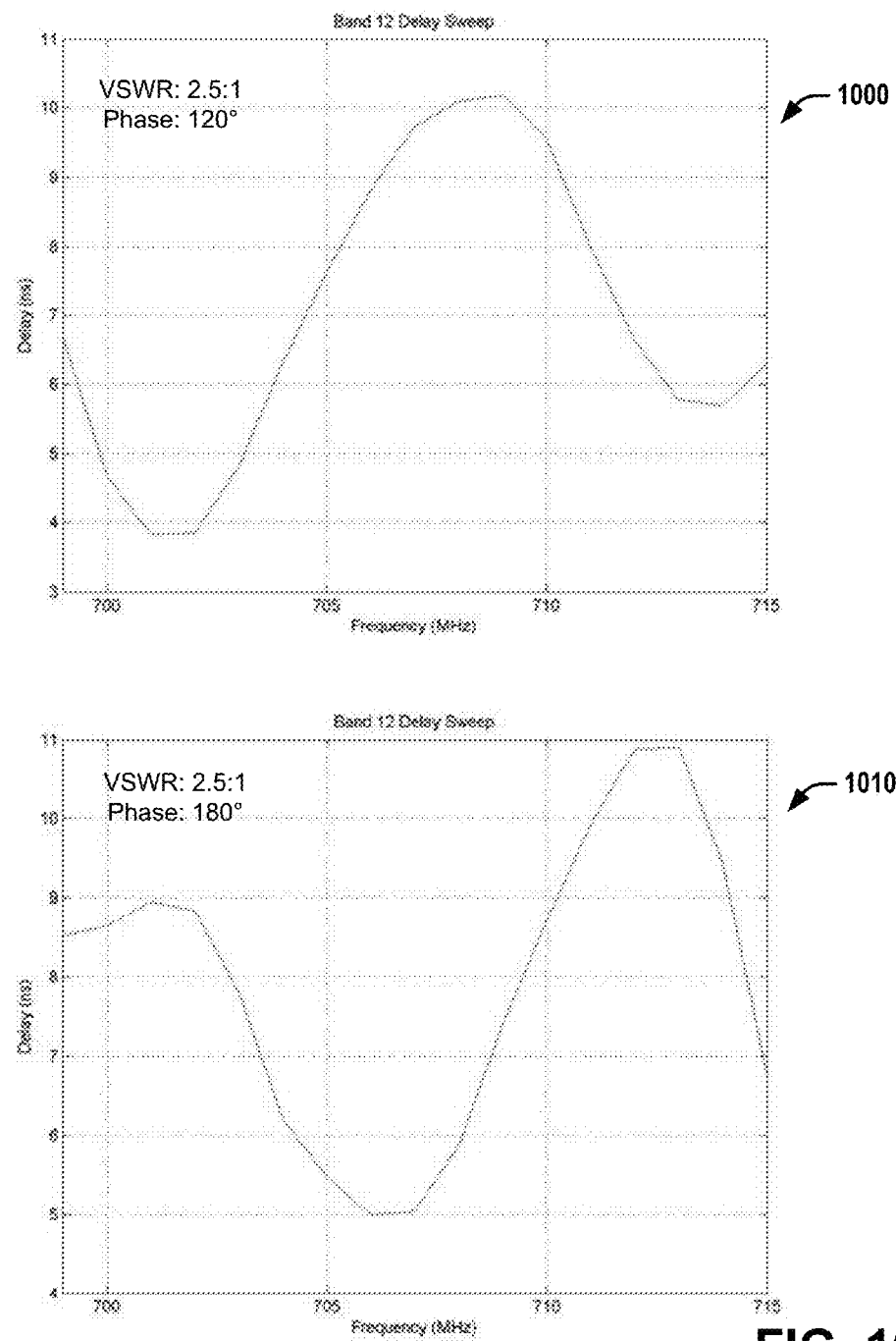
FIG. 10 is a pair of graphs illustrating the optimum delay of an ET path for a VSWR of 2.5:1 at load phases of 120° and 180°.
Figure 11:
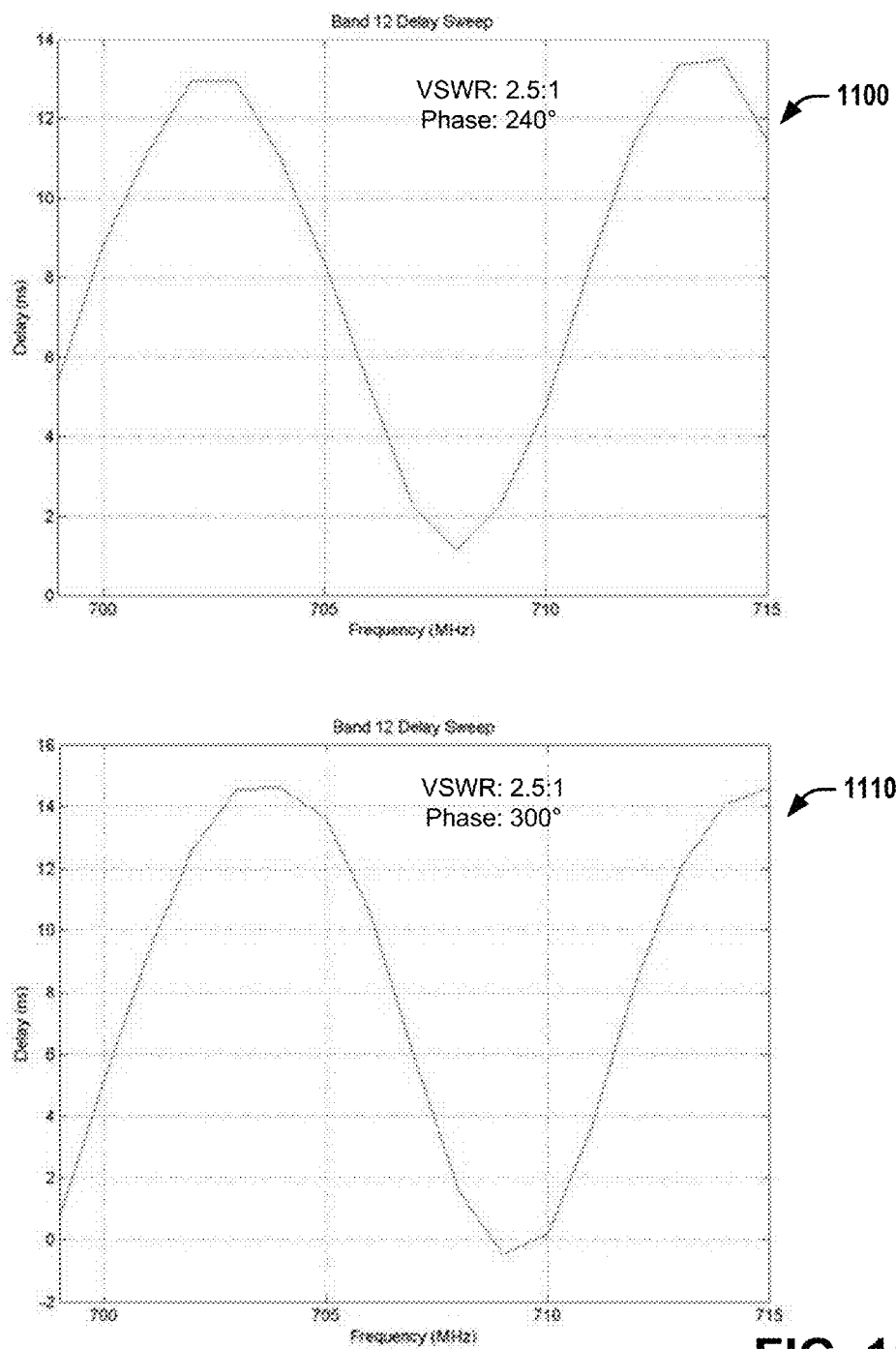
FIG. 11 is a pair of graphs illustrating the optimum delay of an ET path for a VSWR of 2.5:1 at load phases of 240° and 300°.

FIGS. 9-11 show graphs of the optimum delay of the ET path for a voltage standing wave ratio (VSWR) of 2.5:1 at load phases of 0° and 60° in FIG. 9, load phases of 120° and 180° in FIG. 10, and load phases of 240° and 300° in FIG. 11. As an example, at 705 MHz, the optimum delay of the ET path for 0° load phase is ~14 ns (as seen in FIG. 9), while for 180° load phase the optimum is ~6 ns (as seen in FIG. 10). Thus, the optimum delay of the ET pathcan heavily change due to antenna mismatch, causing severe ACLR degradation.

Figure 12:
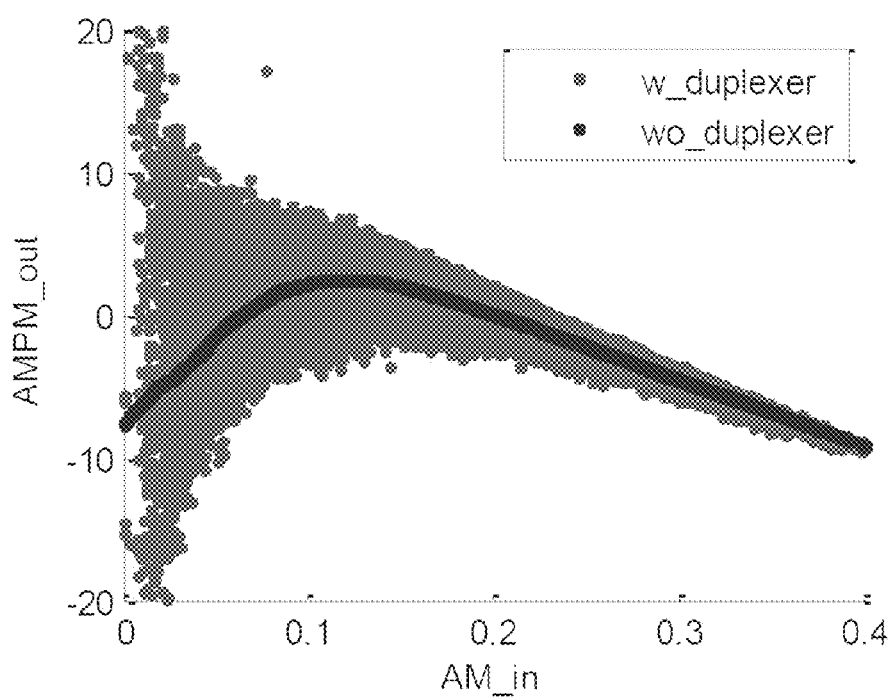
FIG. 12 is a graph illustrating the effects of impedance mismatch between a PA and a duplexer on amplitude-to-phase distortion (AMPM).

Referring to FIG. 12, illustrated is a graph showing the AMPM response of a PA with and without a coupled duplexer. As can be seen, without filtering, the clouding of the response is extremely tight, but with filtering, there is significant clouding. In this example, the Tx signal is located close to band edge and the filter skirts cut part of the distorted Tx spectrum, causing an asymmetric spectrum and subsequent clouding of the AMAM- and AMPM response.

Figure 13:
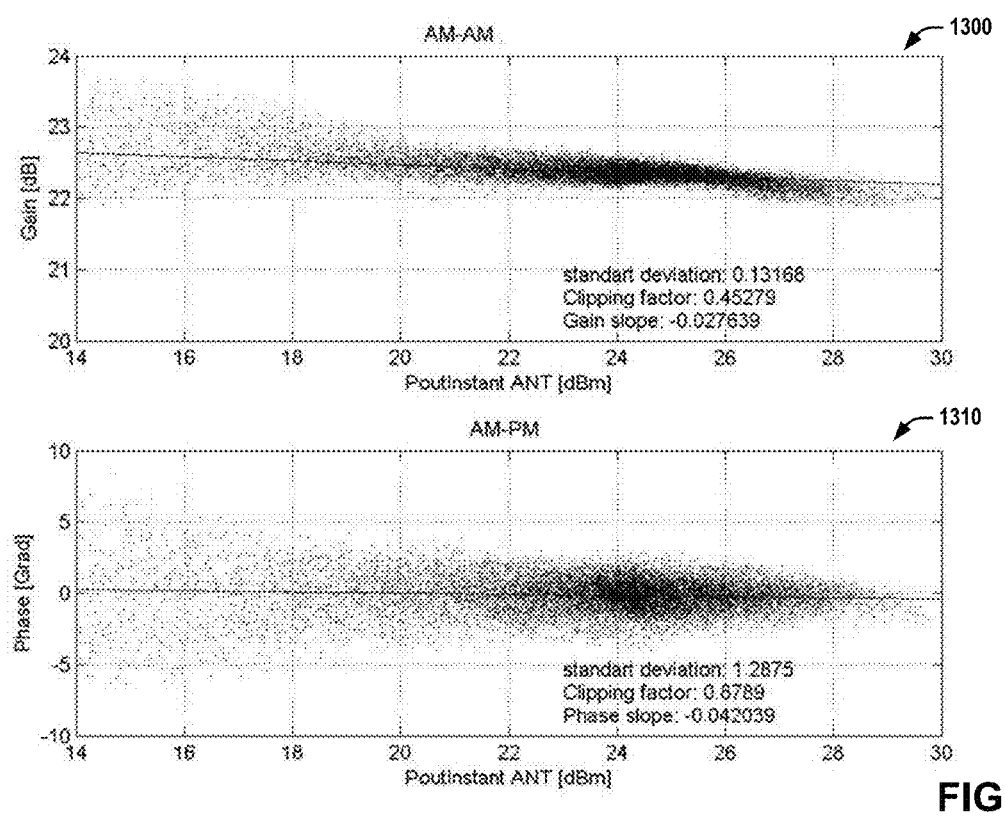
FIG. 13 is a pair of graphs illustrating the measured amplitude-to-amplitude distortion (AMAM) and AMPM response of a Long Term Evolution (LTE) frequency band 25 (LTE-10) 50 resource block (RB) signal at a channel center frequency of 1880 MHz.
Figure 14:
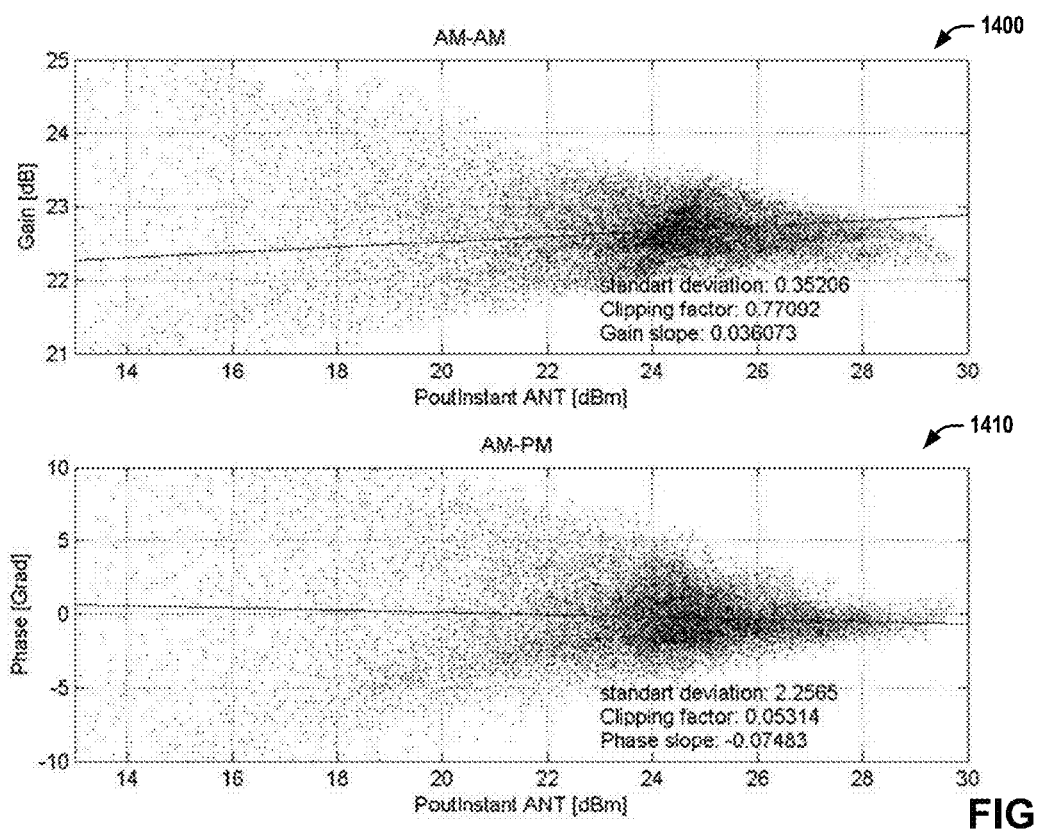
FIG. 14 is a pair of graphs illustrating the measured AMAM and AMPM response of a LTE-10 SORB signal at a frequency of 1910 MHz, near the band edge.

Referring to FIGS. 13 and 14, illustrated are graphs of the AMAM and AMPM response of a Long Term Evolution (LTE) frequency band 25 (LTE-10) 50 resource block (RB) signal at a channel center frequency of 1880 MHz (FIG. 13) and a frequency near the band edge of 1910 MHz (FIG. 14). FIG. 13 shows a center frequency (1880 MHz) where the duplex filter does not attenuate the spectrum due to nonlinear distortions. Accordingly, the AMAM and AMPM response is relatively tight. FIG. 14 shows same situation at the upper band edge (1910 MHz). The upper portion (located at greater than 1915 MHz) of the spectrum is suppressed by the stop-band attenuation of the filter. As a result, the spectrum becomes asymmetric and strong clouding of the AMAM and AMPM response results, as seen in FIG. 14. This is highly inconvenient for DPD, since the filtering introduces strong memory effects.

Figure 15:
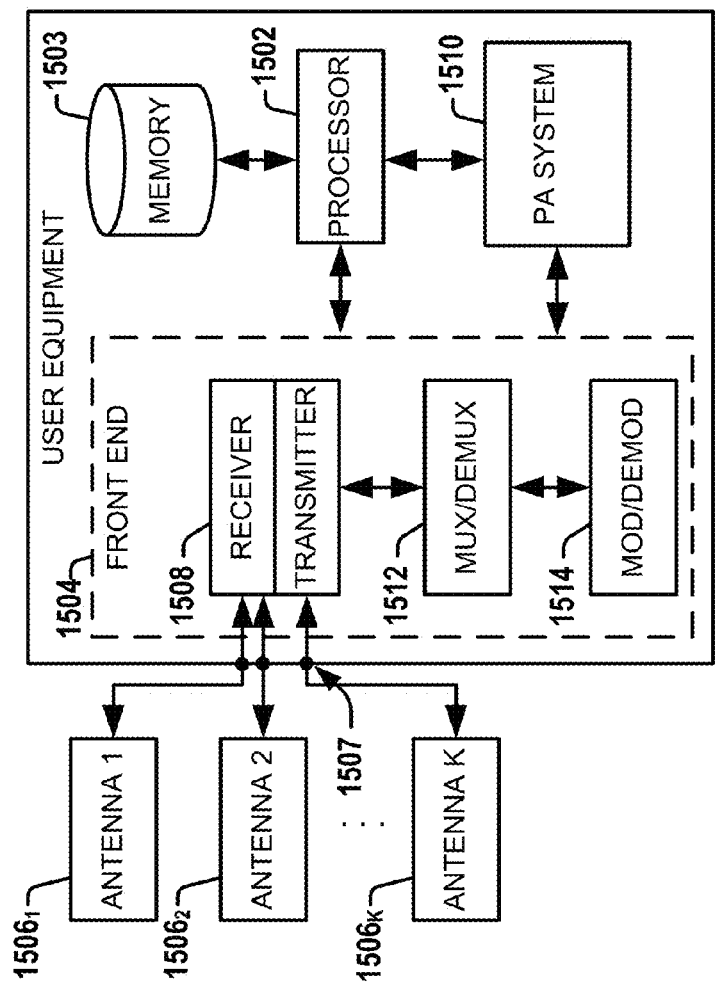
FIG. 15 is a block diagram illustrating an example user equipment useable in connection with various aspects described herein.

Referring to FIG. 15, illustrated is an exemplary user equipment or mobile communication device 1500 that can be utilized with one or more aspects of the systems, methods, or devices that facilitate envelope tracking described herein according to various aspects. The user equipment 1500, for example, comprises a digital baseband processor 1502 that can be coupled to a data store or memory 1503, a front end 1504 (e.g., an RF front end, an acoustic front end, or the other like front end) and a plurality of antenna ports 1507 for connecting to a plurality of antennas $1506_1$ to $1506_k$ (k being a positive integer). The antennas $1506_1$ to $1506_k$ can receive and transmit signals to and from one or more wireless devices such as access points, access terminals, wireless ports, routers and so forth, which can operate within a radio access network or other communication network generated via a network device. The user equipment 1500 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 1504 can include a communication platform, which comprises electronic components and associated circuitry that provide for processing, manipulation or shaping of the received or transmitted signals via one or more receivers or transmitters 1508, a mux/demux component 1512, and a mod/demod component 1514. The front end 1504, for example, is coupled to the digital baseband processor 1502 and the set of antenna ports 1507, in which the set of antennas 1506₁ to 1506ₖ can be part of the front end. In one aspect, the user equipment 1500 can comprise a PA system 1510 that operates with a delay component for providing a delay between a main signal processing path and an envelope tracking path of a PA. The delay can be dynamically (re-) calibrated according to a feedback path from the PA output, for example. In aspects, PA system 1510 can comprise a system as described herein that can facilitate adjustment of one or more PA stimuli (e.g., input RF signal, supply voltage, etc.) based on a measured output signal of the PA, wherein the output signal comprises a forward signal and a reflected signal.

The user equipment 1500 can also include a processor 1502 or a controller that can operate to provide or control one or more components of the user equipment 1500. For example, the processor 1502 can confer functionality, at least in part, to substantially any electronic component within the user equipment 1500, in accordance with aspects of the disclosure. As an example, the processor can be configured to execute, at least in part, executable instructions that control various modes of the PA system 1510 as a multi-mode operation chipset that affords different power generation operations for input signals at the antenna ports 1507, an input terminal or other input terminal based on one or more characteristics of the input signal.

The processor 1502 can operate to enable the mobile communication device 1500 to process data (e.g., symbols, bits, or chips) for multiplexing/demultiplexing with the mux/demux component 1512, or modulation/demodulation via the mod/demod component 1514, such as implementing direct and inverse fast Fourier transforms, selection of modulation rates, selection of data packet formats, inter-packet times, etc. Memory 1503 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 1502 is functionally and/or communicatively coupled (e.g., through a memory bus) to memory 1503 in order to store or retrieve information necessary to operate and confer functionality, at least in part, to communication platform or front end 1504, the PA system 1510 and substantially any other operational aspects of the PA system 1510. The PA system 1510 includes at least one power amplifier in the RF front end 1504 that can employ an envelope tracking mode of operation in order to improve an efficiency or battery life of the user equipment 1500. While the components in FIG. 15 are illustrated in the context of a user equipment, such illustration is not limited to user equipment but also extends to other wireless communication devices, such as base station, small cell, femtocell, macro cell, microcell, etc.

Figure 16:
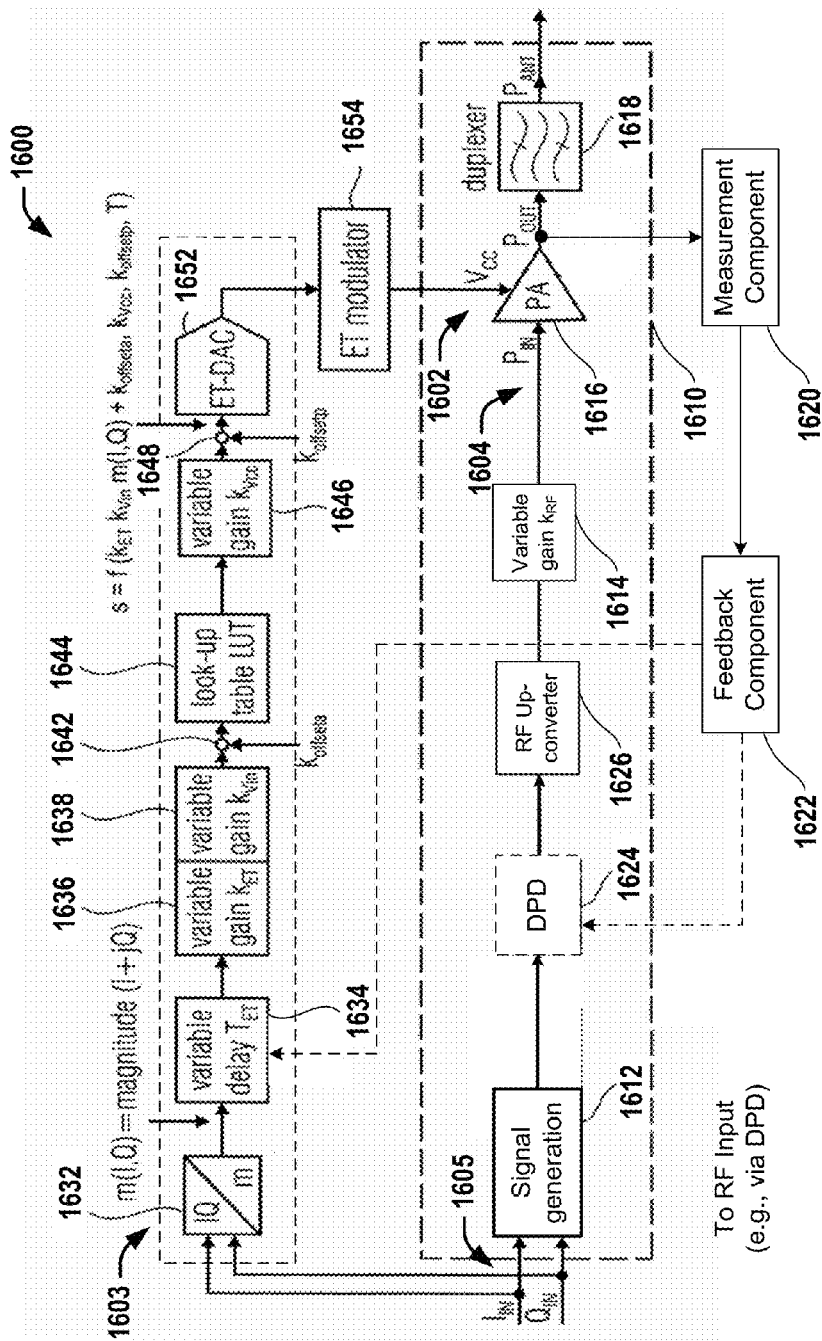
FIG. 16 is a block diagram illustrating a power amplifier (PA) capable of operating in an ET mode in connection with various aspects described herein.

Referring to FIG. 16, illustrated is a schematic block diagram of an envelope tracking system 1600 with a power amplifier 1616 that has an input terminal 1602 that is part of an envelope tracking pathway 1603 and an input terminal 1604 that is part of a signal generation pathway 1610. An input terminal 1605 or an input signal 1605 (e.g., a differential signal, a single ended signal, an RF signal, an acoustic signal, or other like communication signal) to be processed or transmitted, can comprise, for example, an in-phase component $I_{IN}$ and a quadrature component $Q_{IN}$. Alternatively or additionally, the input signal 1605 can comprise a different format as a single or a differential signal. The input signal 1605 is received by a signal generation path 1610 that comprises an RF signal generation component 1612, an optional DPD component 1624, a variable gain element 1614, a power amplifier (PA) 1616, and a duplexer 1618. The signal generation component 1612 can be configured to perform frequency up-conversion, for example, from a baseband (BB) frequency range to a radio frequency range, or generate a different conversion operation, such as a digital-to-analog conversion of the input signal 1605. The DPD component 1624 can digitally pre-distort the input signal to compensate for distortion effects introduced by other components, after which the signal can be up-converted by an RF up-converter 626. The variable gain element 1614 is configured to multiply an output of the signal generation component 1612 with a variable gain (e.g., $k_{rf}$) that serves to achieve a desired gain setting of the entire signal generation path 1614 as part of the power amplifier system 1600. The power amplifier 1616 amplifies the signal provided by the variable gain element 1614, wherein an input power of the PA 1616 is $P_{IN}$ and an output power is $P_{OUT}$. The amplified amplifier output signal (Pout) is then fed to the duplexer 1618, which separates transmitted and received signals in the frequency domain. At an antenna port of the duplexer 1618, the output signal is typically slightly attenuated to an antenna power $P_{ANT}$, compared to the output power $P_{OUT}$ of the power amplifier 1616.

In various aspects discussed herein, the amplifier output signal can also be provided to a measurement component 1620, which can measure the output signal comprising both a forward signal associated with the PA and a reflected signal associated with the duplexer. Measurement component 1620 can provide the measured output signal to a feedback component 1622 that can adjust one or more of the PA stimuli (e.g., PA input signal, supply voltage, etc.) based on the measured output signal. For example, the measured output signal can be provided to DPD component 1624 to digitally pre-distort the PA input signal based on the PA output signal. Additionally or alternatively, the feedback component 1622 can determine a delay associated with the output signal (e.g., by comparison with a reference signal from the envelope tracking path 1603), and adjust the delay of the envelope tracking path 1603 based on the delay associated with the output signal (e.g., to reach a target delay obtained during an initial calibration procedure, thereby reducing the ET delay to substantially zero).

One envelope tracking specific design target on a system level is a flat AMPM- and AMAM phase response of the PA 1616 versus PA supply voltage $V_{CC}$ and across output power (in this context PA supply voltage $V_{CC}$ refers to the voltage that is influenced by an envelope tracking operation, for example, the supply voltage of a $2^{nd}$ PA stage). The abbreviation AMPM stands for "amplitude-to-phase distortion" and the abbreviation AMAM stands for "amplitude-to-amplitude distortion".

The lookup table 1644 can be part of the envelope tracking path 1603 or a supply voltage processing path, which is depicted above the main signal generation path 1610. The supply voltage processing path 1603 is also considered a part of the envelope tracking system 1600. The supply voltage processing path 1603 can comprise a vector-to-magnitude converter 1632 (e.g., implementing a CORDIC algorithm, etc.). The instantaneous magnitude of the input signal 1605 can be expressed as m(I,Q)=magnitude (I+jQ), which is forwarded to a variable delay element 1634 configured to delay the magnitude signal by a delay $T_{ET}$ (which can, as discussed herein, be adjusted based on the output signal from PA 1616) to aid in synchronizing the variation in $V_{CC}$ with the envelope of the RF signal in the signal generation path 1610. The supply voltage processing path 1603 further comprises a variable gain element 1636 with a variable gain $k_{ET}$. The variable gain $k_{ET}$ can be synchronized with the variable gain $k_{rf}$ of the transmitter (not explicitly shown in FIG. 16). At a summing element 1642, an input signal offset $k_{offseta}$ is added before the signal is provided to a lookup table (LUT) 1644. The lookup table 1644 implements a nonlinear transfer function or at least the basic shape of the nonlinear transfer function. The supply voltage processing path 1603 further comprises a further variable gain element 1646 for applying a variable gain $k_{VCC}$ to an output signal of the lookup table 1644. At a further summing element 1648 an output signal offset $k_{offsetp}$ is added before the signal is digital-to-analog converted by an envelope tracking digital-to-analog converter (ET-DAC) 1652. An analog output signal of the ET-DAC 1652 is provided to the ET modulator 1654 (e.g., ET DC-DC voltage provider) as a variable or dynamic control signal and to cause the ET modulator 1654 to provide a corresponding supply voltage $V_{CC}$ to the envelope tracking power amplifier 1616 for providing an output voltage or output power signal at a maximum efficiency.

The delay of the delay component 1634 can be sensitive to part-to-part variations along the main signal processing path 1610 and the envelope tracking path 1603, as well as to aging and PVT dependencies, for example. Therefore, the delay is calibrated during production of the power amplifier system 1600 or of a communication device/transmitter/receiver/transceiver that comprises the power amplifier system 1600. In one aspect, re-calibration is dynamic and can be facilitated by the power system 1600 after production on-the-fly or in real-time during an active transmission or during active communications of the device in the field during an active transmission mode or an active mode of operation in order to compensate for the aging effects, PVT dependencies, or other variations.

In some instances, the variable delay may only be calibrated once during factory calibration for a 50 ohm termination. However, factory calibration has different limitations as follows: (1) the delay might change over time, and (2) the factory calibration process does not fully reflect real-life use cases of a mobile device (e.g., the antenna impedance does change depending on the position of the mobile communication device relative to the mobile device user). Antenna impedance change can also affect the PA behavior (e.g., for some antenna impedances the PA supply $V_{CC}$ has to be increased to maintain antenna output power and for other antenna impedances the PA supply Vcc needs to be decreased to reach the same output power). As a result, the actual delay or actual delay function of the delay component 1634 is subject to deviate from a target delay that was established during factory calibration in a calibration mode, for example, which is different from an active transmission mode in the field or thereafter. As such, these variations can cause degradation of an adjacent channel leakage ratio (ACLR) or an error vector magnitude (EVM) performance, for example. These conditions discussed above can be mitigated or avoided by dynamically re-adjusting the delay or the delay function of the delay component $T_{ET}$ 1634 according to various aspects described.

Several measures can be carried out to compensate possible delay changes. The power amplifier system 1600 can perform dynamic calibration or setting of the delay component 1634 in the envelope tracking path 1603 according to 1) a re-calibration during an active transmission or an active power generation mode of the power amplifier during operation, 2) on-the-fly re-calibration without interfering with the information inherent in the received input signal 1605 (e.g., an RF signal, acoustic signal or the like), or 3) on-the-fly re-calibration without violation of the spectral mask of the input signal 1605.

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a system that facilitates compensation for one or more effects of an impedance mismatch with at least one filter, comprising a power amplifier (PA), a measurement component, and a feedback component. The PA is configured to receive PA stimuli comprising a supply voltage and a radio frequency (RF) signal and to amplify the RF signal to generate an output signal to the at least one filter. The measurement component is coupled to the PA and configured to measure the output signal from the PA, wherein the output signal comprises a forward signal associated with the PA and a reflected signal associated with the at least one filter. The feedback component is configured to receive the output signal and to adjust one or more of the PA stimuli based at least in part on the output signal.

Example 2 includes the subject matter of example 1, further comprising an envelope tracking (ET) component configured to provide the supply voltage to the PA according to an ET mode that depends upon the envelope of the RF signal and is based at least in part on a delay of an ET path. The adjusted one or more PA stimuli comprises the supply voltage, and the feedback component comprises a delay adjustment component configured to adjust the delay of the ET path based at least in part on a delay of the output signal.

Example 3 includes the subject matter of example 2, wherein the feedback component comprises a delay measurement component configured to determine the delay of the output signal relative to a reference signal.

Example 4 includes the subject matter of example 3, wherein the delay measurement component is further configured to determine an envelope associated with the output signal, wherein the delay measurement component is configured to determine the delay of the output signal based at least in part on the envelope associated with the output signal.

Example 5 includes the subject matter of any of examples 3-4, including or omitting optional features, wherein the delay measurement component is further configured to normalize the envelope.

Example 6 includes the subject matter of any of examples 2-5, including or omitting optional features, wherein the delay adjustment component is further configured to adjust the delay of the ET path based on a comparison between the delay of the output signal and a target delay.

Example 7 includes the subject matter of any variation of example 6, including or omitting optional features, wherein the delay adjustment component is configured to determine the target delay in connection with an initial calibration procedure.

Example 8 includes the subject matter of any of examples 6-7, including or omitting optional features, wherein the delay adjustment component is configured to adjust the delay of the ET path to reduce a difference between the delay of the output signal and the target delay below a threshold difference.

Example 9 includes the subject matter of any of examples 2-8, including or omitting optional features, wherein the delay adjustment component is further configured to determine whether a distortion associated with the output signal exceeds a threshold value.

Example 10 includes the subject matter of any variation of example 9, including or omitting optional features, further comprising an average power tracking (APT) component, wherein the APT component is configured to provide the supply voltage according to an APT mode that approximates an average power expected in a next period of time, in response to a determination that the distortion exceeds the threshold value.

Example 11 includes the subject matter of any of examples 9-10, including or omitting optional features, wherein the ET component is configured to increase a power of the supply voltage in response to a determination that the distortion exceeds the threshold value.

Example 12 includes the subject matter of any of examples 1-11, including or omitting optional features, wherein the output signal comprises a voltage at an output terminal of the PA.

Example 13 includes the subject matter of any of examples 1-12, including or omitting optional features, wherein the adjusted one or more PA stimuli comprises the RF signal, and wherein the feedback component comprises a digital pre-distortion (DPD) component configured to receive the RF signal and the output signal, wherein the DPD component is further configured to digitally pre-distort the RF signal based at least in part on the output signal.

Example 14 includes the subject matter of example 3, wherein the delay measurement component is further configured to normalize the envelope.

Example 15 includes the subject matter of example 2, wherein the delay adjustment component is further configured to adjust the delay of the ET path based on a comparison between the delay of the output signal and a target delay.

Example 16 includes the subject matter of example 15, wherein the delay adjustment component is configured to determine the target delay in connection with an initial calibration procedure.

Example 17 includes the subject matter of example 15, wherein the delay adjustment component is configured to adjust the delay of the ET path to reduce a difference between the delay of the output signal and the target delay below a threshold difference.

Example 18 includes the subject matter of example 2, wherein the delay adjustment component is further configured to determine whether a distortion associated with the output signal exceeds a threshold value.

Example 19 includes the subject matter of example 18, further comprising an average power tracking (APT) component, wherein the APT component is configured to provide the supply voltage according to an APT mode that approximates an average power expected in a next period of time, in response to a determination that the distortion exceeds the threshold value.

Example 20 includes the subject matter of example 18, wherein the ET component is configured to increase a power of the supply voltage in response to a determination that the distortion exceeds the threshold value.

Example 21 includes the subject matter of example 1, wherein the output signal comprises a voltage at an output terminal of the PA.

Example 22 includes the subject matter of example 1, wherein the adjusted one or more PA stimuli comprises the RF signal, and wherein the feedback component comprises a digital pre-distortion (DPD) component configured to receive the RF signal and the output signal, wherein the DPD component is further configured to digitally pre-distort the RF signal based at least in part on the output signal.

Example 23 is a method that facilitates compensation for one or more effects of an impedance mismatch with at least one filter. The method includes receiving one or more power amplifier (PA) stimuli comprising a supply voltage and a radio frequency (RF) signal; amplifying the RF signal to generate an output signal comprising a forward signal and a reflected signal; measuring the output signal; and adjusting one or more of the PA stimuli based at least in part on the output signal.

Example 24 includes the subject matter of example 23, further comprising digitally pre-distorting the RF signal based at least in part on the output signal, wherein the adjusted one or more PA stimuli comprises the RF signal.

Example 25 includes the subject matter of example 23, further comprising:
providing the supply voltage to the PA according to an envelope tracking (ET) mode that depends upon the envelope of the RF signal and is based at least in part on a delay of an ET path; determining a delay of the output signal relative to a reference signal; and adjusting the delay of the ET path based at least in part on the delay of the output signal.

Example 26 includes the subject matter of example 25, wherein determining the delay of the output signal comprises determining an envelope associated with the output signal.

Example 27 includes the subject matter of example 26, wherein determining the delay of the output signal comprises normalizing the envelope.

Example 28 includes the subject matter of example 25, wherein adjusting the delay of the ET path comprises adjusting the delay of the ET path based on a comparison between the delay of the output signal and a target delay.

Example 29 includes the subject matter of example 28, further comprising determining the target delay in connection with an initial calibration procedure.

Example 30 includes the subject matter of example 28, wherein adjusting the delay of the ET path comprises reducing a difference between the delay of the output signal and the target delay below a threshold difference.

Example 31 includes the subject matter of any of examples 25-30, including or omitting optional features, further comprising determining whether a distortion associated with the output signal exceeds a threshold value.

Example 32 includes the subject matter of any variation of example 31, including or omitting optional features, further comprising providing the supply voltage according to an average power tracking (APT) mode that approximates an average power expected in a next period of time, in response to a determination that the distortion exceeds the threshold value.

Example 33 includes the subject matter of example 30, further comprising determining whether a distortion associated with the output signal exceeds a threshold value.

Example 34 includes the subject matter of example 33, further comprising providing the supply voltage according to an average power tracking (APT) mode that approximates an average power expected in a next period of time, in response to a determination that the distortion exceeds the threshold value.

Example 35 is a system that facilitates optimization of a delay of an envelope tracking (ET) path, comprising a power amplifier (PA), an envelope tracking (ET) component, a measurement component, a delay measurement component, and a delay adjustment component. The PA is configured to receive a supply voltage and a radio frequency (RF) signal and to amplify the RF signal, wherein an output of the PA is configured to be coupled to at least one filter. The ET component is configured to provide the supply voltage to the PA, based on the envelope of the RF signal and at least in part on the delay of the ET path. The measurement component is coupled to the PA and configured to measure an output voltage at the output of the PA, wherein the output voltage comprises a forward signal associated with the PA and a reflected signal associated with the at least one filter. The delay measurement component is configured to measure a delay of the output voltage relative to a reference signal The delay adjustment component is configured to adjust the delay of the ET path based at least in part on the measured delay and a target delay.

Example 36 includes the subject matter of example 35, further comprising a digital pre-distortion (DPD) component configured to receive the RF signal and the output voltage, wherein the DPD component is further configured to digitally pre-distort the RF signal based at least in part on the output voltage.

Example 37 is a system that facilitates compensation for one or more effects of an impedance mismatch with at least one filter, comprising means for amplification, means for measurement, and means for providing feedback. The means for amplification is configured to receive means for amplification stimuli comprising a supply voltage and a radio frequency (RF) signal and to amplify the RF signal to generate an output signal to the at least one filter. The means for measurement is coupled to the means for amplification and configured to configured to measure the output signal from the means for amplification, wherein the output signal comprises a forward signal associated with the means for amplification and a reflected signal associated with the at least one filter. The means for providing feedback is configured to receive the output signal and to adjust one or more of the means for amplification stimuli based at least in part on the output signal.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. A system for compensating for one or more effects of an impedance mismatch with at least one filter, comprising:
    a power amplifier (PA) configured to receive PA stimuli comprising a supply voltage and a radio frequency (RF) signal and to amplify the RF signal to generate an output signal to the at least one filter;
    a measurement component coupled to the PA and configured to measure the output signal from the PA, wherein the output signal comprises a forward signal associated with the PA and a reflected signal associated with the at least one filter; and
    a feedback component configured to receive the output signal and to adjust one or more of the PA stimuli based at least in part on the output signal.

2. The system of claim 1, further comprising an envelope tracking (ET) component configured to provide the supply voltage to the PA according to an ET mode that depends upon the envelope of the RF signal and is based at least in part on a delay of an ET path,
    wherein the adjusted one or more PA stimuli comprises the supply voltage, and wherein the feedback component comprises a delay adjustment component configured to adjust the delay of the ET path based at least in part on a delay of the output signal.

3. The system of claim 2, wherein the feedback component comprises a delay measurement component configured to determine the delay of the output signal relative to a reference signal.

4. The system of claim 3, wherein the delay measurement component is further configured to determine an envelope associated with the output signal, wherein the delay measurement component is configured to determine the delay of the output signal based at least in part on the envelope associated with the output signal.

5. The system of claim 3, wherein the delay measurement component is further configured to normalize the envelope.

6. The system of claim 2, wherein the delay adjustment component is further configured to adjust the delay of the ET path based on a comparison between the delay of the output signal and a target delay.

7. The system of claim 6, wherein the delay adjustment component is configured to determine the target delay in connection with an initial calibration procedure.

8. The system of claim 6, wherein the delay adjustment component is configured to adjust the delay of the ET path to reduce a difference between the delay of the output signal and the target delay below a threshold difference.

9. The system of claim 2, wherein the delay adjustment component is further configured to determine whether a distortion associated with the output signal exceeds a threshold value.

10. The system of claim 9, further comprising an average power tracking (APT) component, wherein the APT component is configured to provide the supply voltage according to an APT mode that approximates an average power expected in a next period of time, in response to a determination that the distortion exceeds the threshold value.

11. The system of claim 9, wherein the ET component is configured to increase a power of the supply voltage in response to a determination that the distortion exceeds the threshold value.

12. The system of claim 1, wherein the output signal comprises a voltage at an output terminal of the PA.

13. The system of claim 1, wherein the adjusted one or more PA stimuli comprises the RF signal, and wherein the feedback component comprises a digital pre-distortion (DPD) component configured to receive the RF signal and the output signal, wherein the DPD component is further configured to digitally pre-distort the RF signal based at least in part on the output signal.

14. A method for compensating for one or more effects of an impedance mismatch with at least one filter, comprising:
receiving one or more power amplifier (PA) stimuli comprising a supply voltage and a radio frequency (RF) signal;
amplifying the RF signal to generate an output signal to the at least one filter comprising a forward signal and a reflected signal;
measuring the output signal; and
adjusting one or more of the PA stimuli based at least in part on the output signal.

15. The method of claim 14, further comprising digitally pre-distorting the RF signal based at least in part on the output signal, wherein the adjusted one or more PA stimuli comprises the RF signal.

16. The method of claim 14, further comprising:
providing the supply voltage to the PA according to an envelope tracking (ET) mode that depends upon the envelope of the RF signal and is based at least in part on a delay of an ET path;
determining a delay of the output signal relative to a reference signal; and
adjusting the delay of the ET path based at least in part on the delay of the output signal.

17. The method of claim 16, wherein determining the delay of the output signal comprises determining an envelope associated with the output signal.

18. The method of claim 17, wherein determining the delay of the output signal comprises normalizing the envelope.

19. The method of claim 16, wherein adjusting the delay of the ET path comprises adjusting the delay of the ET path based on a comparison between the delay of the output signal and a target delay.

20. The method of claim 19, further comprising determining the target delay in connection with an initial calibration procedure.

21. The method of claim 19, wherein adjusting the delay of the ET path comprises reducing a difference between the delay of the output signal and the target delay below a threshold difference.

22. The method of claim 16, further comprising determining whether a distortion associated with the output signal exceeds a threshold value.

23. The method of claim 22, further comprising providing the supply voltage according to an average power tracking (APT) mode that approximates an average power expected in a next period of time, in response to a determination that the distortion exceeds the threshold value.

24. A system for optimizing a delay of an envelope tracking (ET) path, comprising:
a power amplifier (PA) configured to receive a supply voltage and a radio frequency (RF) signal and to amplify the RF signal, wherein an output of the PA is configured to be coupled to at least one filter;
an envelope tracking (ET) component configured to provide the supply voltage to the PA, based on the envelope of the RF signal and at least in part on the delay of the ET path;
a measurement component coupled to the PA and configured to measure an output voltage at the output of the PA, wherein the output voltage comprises a forward signal associated with the PA and a reflected signal associated with the at least one filter;
a delay measurement component configured to measure a delay of the output voltage relative to a reference signal; and
a delay adjustment component configured to adjust the delay of the ET path based at least in part on the measured delay and a target delay.

25. The system of claim 24, further comprising a digital pre-distortion (DPD) component configured to receive the RF signal and the output voltage, wherein the DPD component is further configured to digitally pre-distort the RF signal based at least in part on the output voltage.

* * * * *